US012568733B2

(12) United States Patent
Matsumoto

(10) Patent No.: US 12,568,733 B2
(45) Date of Patent: Mar. 3, 2026

(54) DISPLAY DEVICE MANUFACTURING METHOD

(71) Applicant: Magnolia White Corporation, Tokyo (JP)

(72) Inventor: Yuko Matsumoto, Tokyo (JP)

(73) Assignee: MAGNOLIA WHITE CORPORATION, Tokyo (JP)

( * ) Notice: Subject to any disclaimer, the term of this patent is extended or adjusted under 35 U.S.C. 154(b) by 394 days.

(21) Appl. No.: 18/298,382

(22) Filed: Apr. 11, 2023

(65) Prior Publication Data

US 2023/0345762 A1 Oct. 26, 2023

(30) Foreign Application Priority Data

Apr. 21, 2022 (JP) ................................. 2022-070105

(51) Int. Cl.
| | |
|---|---|
| *H10K 59/12* | (2023.01) |
| *H10K 59/122* | (2023.01) |
| *H10K 59/80* | (2023.01) |
| *H10K 71/16* | (2023.01) |

(52) U.S. Cl.
CPC ....... *H10K 59/1201* (2023.02); *H10K 59/122* (2023.02); *H10K 59/873* (2023.02); *H10K 71/166* (2023.02)

(58) Field of Classification Search
CPC ............... H10K 71/166; H10K 59/122; H10K 59/1201; H10K 59/873
See application file for complete search history.

(56) References Cited

U.S. PATENT DOCUMENTS

| | | |
|---|---|---|
| 2004/0160170 A1 | 8/2004 | Sato et al. |
| 2005/0032453 A1 | 2/2005 | Tachikawa et al. |
| 2009/0009069 A1 | 1/2009 | Takata |
| 2012/0276484 A1 | 11/2012 | Izumi et al. |
| 2013/0084531 A1* | 4/2013 | Hamaguchi .......... H10K 71/233 430/319 |
| 2016/0190508 A1* | 6/2016 | Nakamura ........... H10K 50/844 257/40 |
| 2016/0380040 A1* | 12/2016 | Tada .................. H10K 59/1315 257/72 |
| 2017/0141180 A1* | 5/2017 | Matsumoto .......... H10K 59/122 |
| 2019/0363275 A1 | 11/2019 | Ochi et al. |

(Continued)

FOREIGN PATENT DOCUMENTS

| | | |
|---|---|---|
| JP | 2000-36385 A | 2/2000 |
| JP | 2000-195677 A | 7/2000 |
| JP | 2003-317949 A | 11/2003 |

(Continued)

*Primary Examiner* — Vongsavanh Sengdara
(74) *Attorney, Agent, or Firm* — XSENSUS LLP

(57) ABSTRACT

According to one embodiment, a display device manufacturing method includes forming a first lower electrode of a first sub-pixel, a second lower electrode of a second sub-pixel, and a third lower electrode of a third sub-pixel, forming a first thin film, forming a negative first resist, removing the first thin film of the second sub-pixel and the third sub-pixel using the first resist as a mask, forming a second thin film, forming a negative second resist, removing the second thin film of the third sub-pixel using the second resist as a mask, forming a positive third resist, removing the second thin film of the first sub-pixel using the third resist as a mask.

20 Claims, 15 Drawing Sheets

(56) References Cited

U.S. PATENT DOCUMENTS

2022/0077251 A1    3/2022  Choung et al.

FOREIGN PATENT DOCUMENTS

| JP | 2004-207217 | A | 7/2004 |
|----|-------------|---|--------|
| JP | 2008-135325 | A | 6/2008 |
| JP | 2009-32673 | A | 2/2009 |
| JP | 2010-118191 | A | 5/2010 |
| JP | 2012-238580 | A | 12/2012 |
| JP | 2013-84576 | A | 5/2013 |
| JP | 2017-529651 | A | 10/2017 |
| WO | 2016/019273 | A1 | 2/2016 |
| WO | 2018/179308 | A1 | 10/2018 |

* cited by examiner

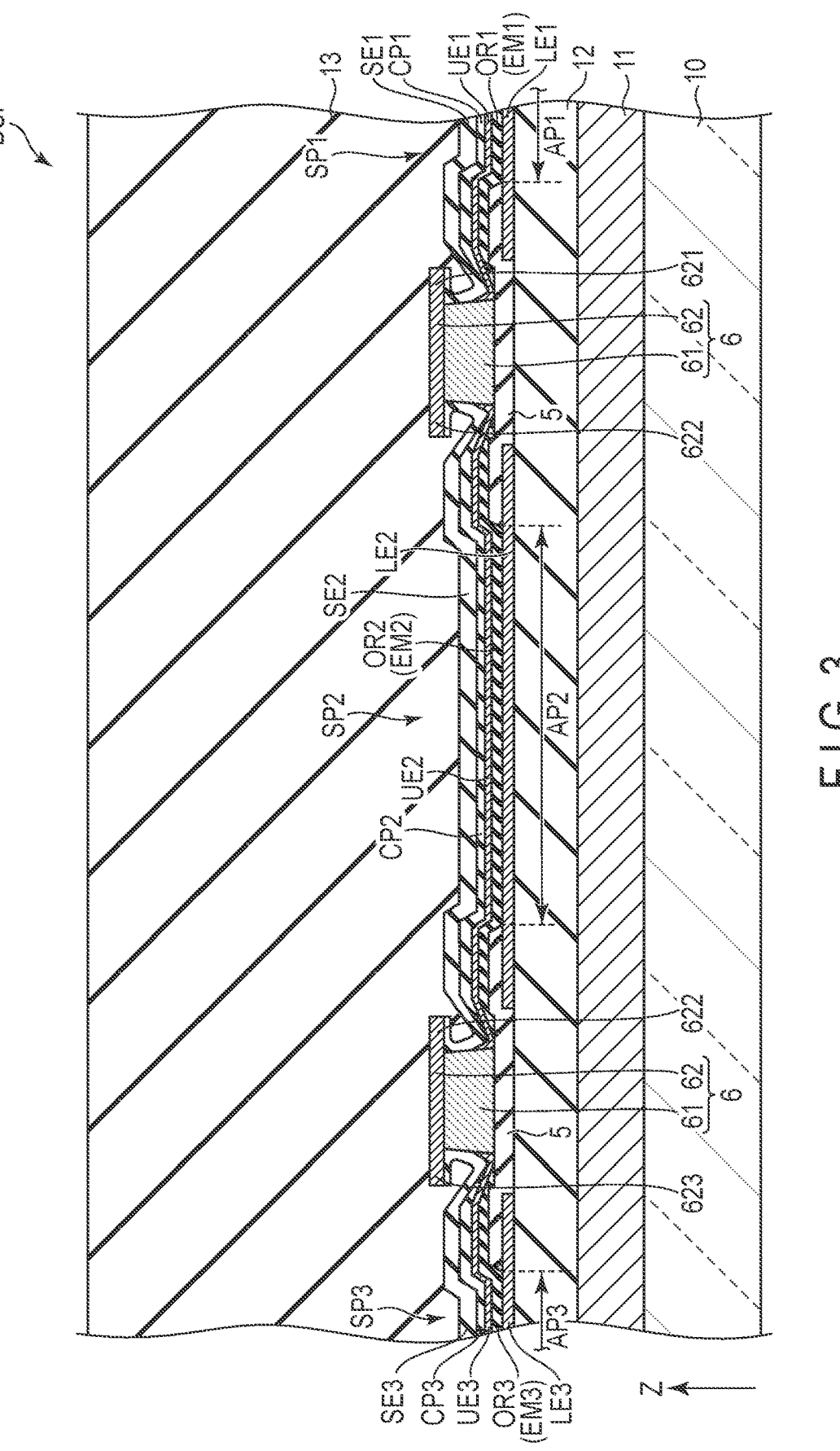
F I G. 3

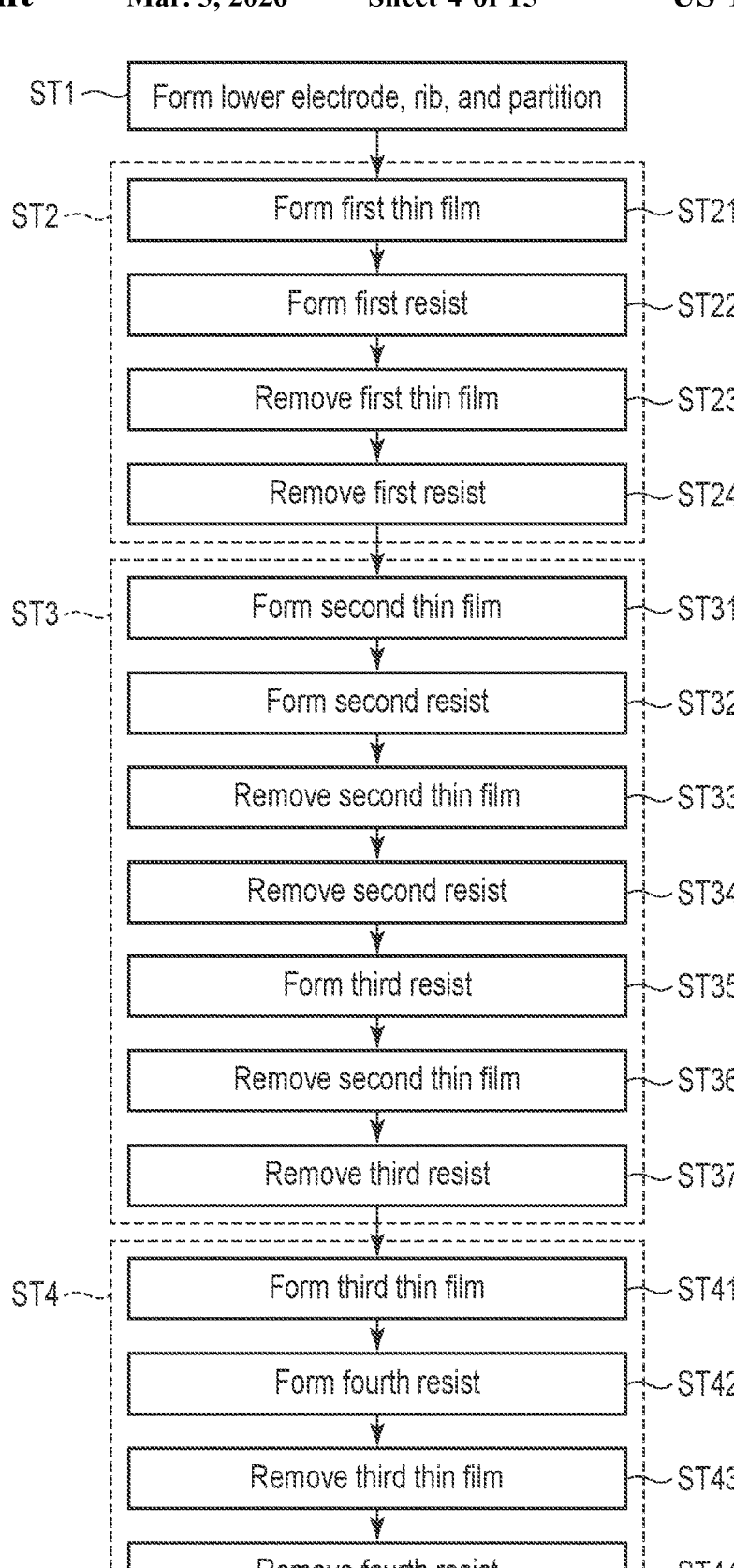

ST1 — Form lower electrode, rib, and partition

ST2
- Form first thin film — ST21
- Form first resist — ST22
- Remove first thin film — ST23
- Remove first resist — ST24

ST3
- Form second thin film — ST31
- Form second resist — ST32
- Remove second thin film — ST33
- Remove second resist — ST34
- Form third resist — ST35
- Remove second thin film — ST36
- Remove third resist — ST37

ST4
- Form third thin film — ST41
- Form fourth resist — ST42
- Remove third thin film — ST43
- Remove fourth resist — ST44

F I G. 4

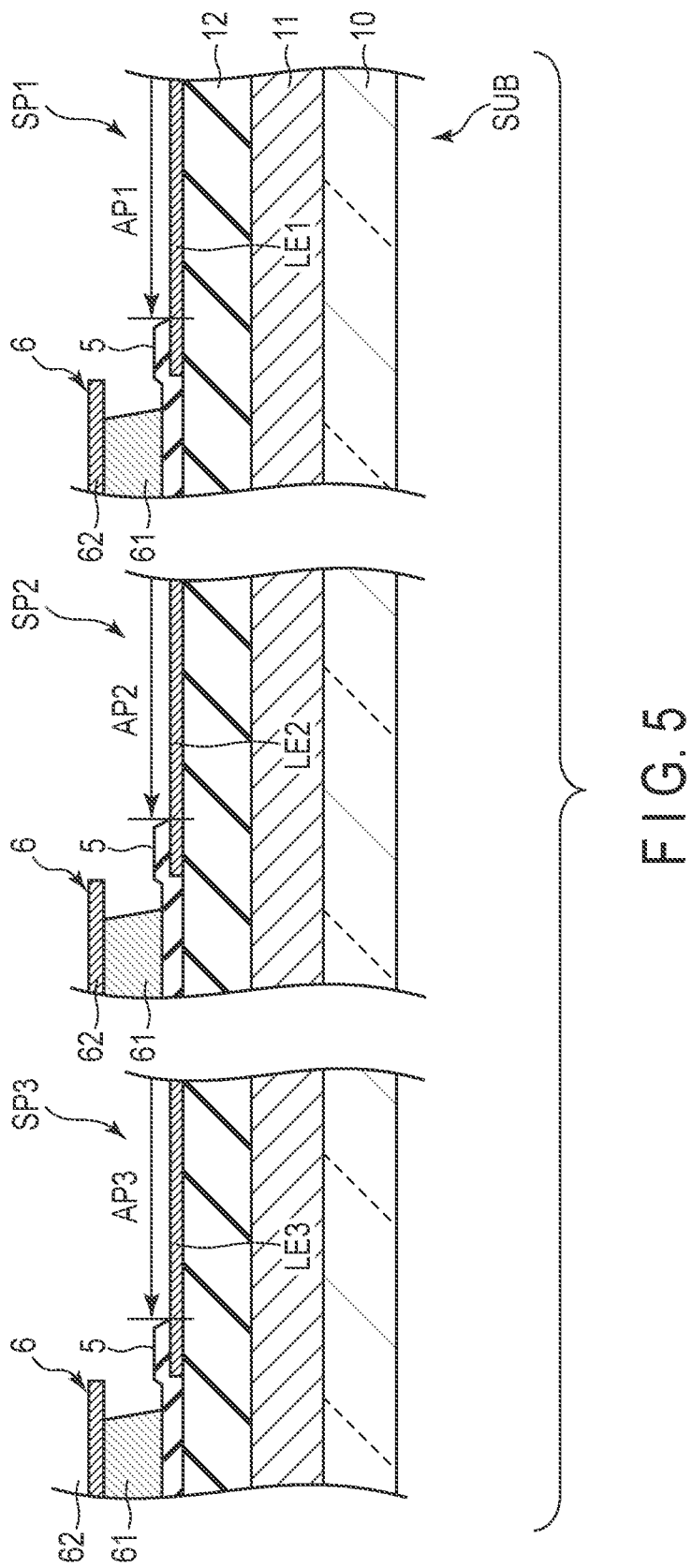
F I G. 5

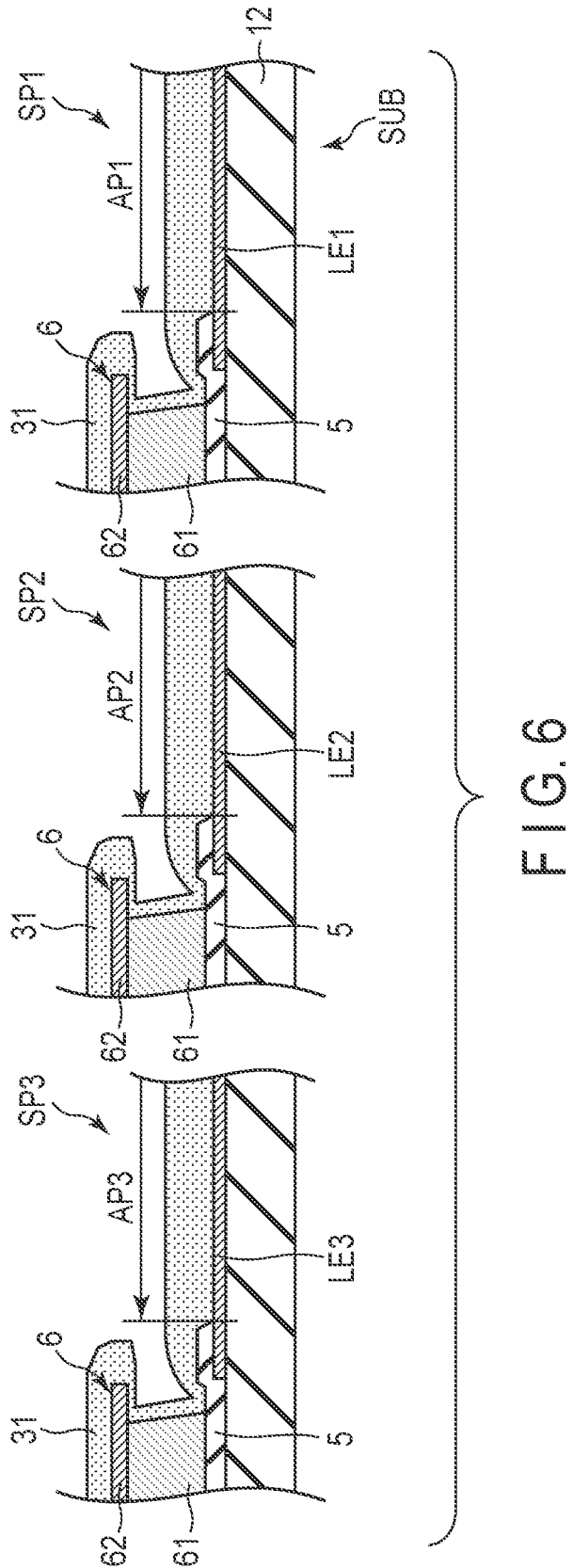
F I G. 6

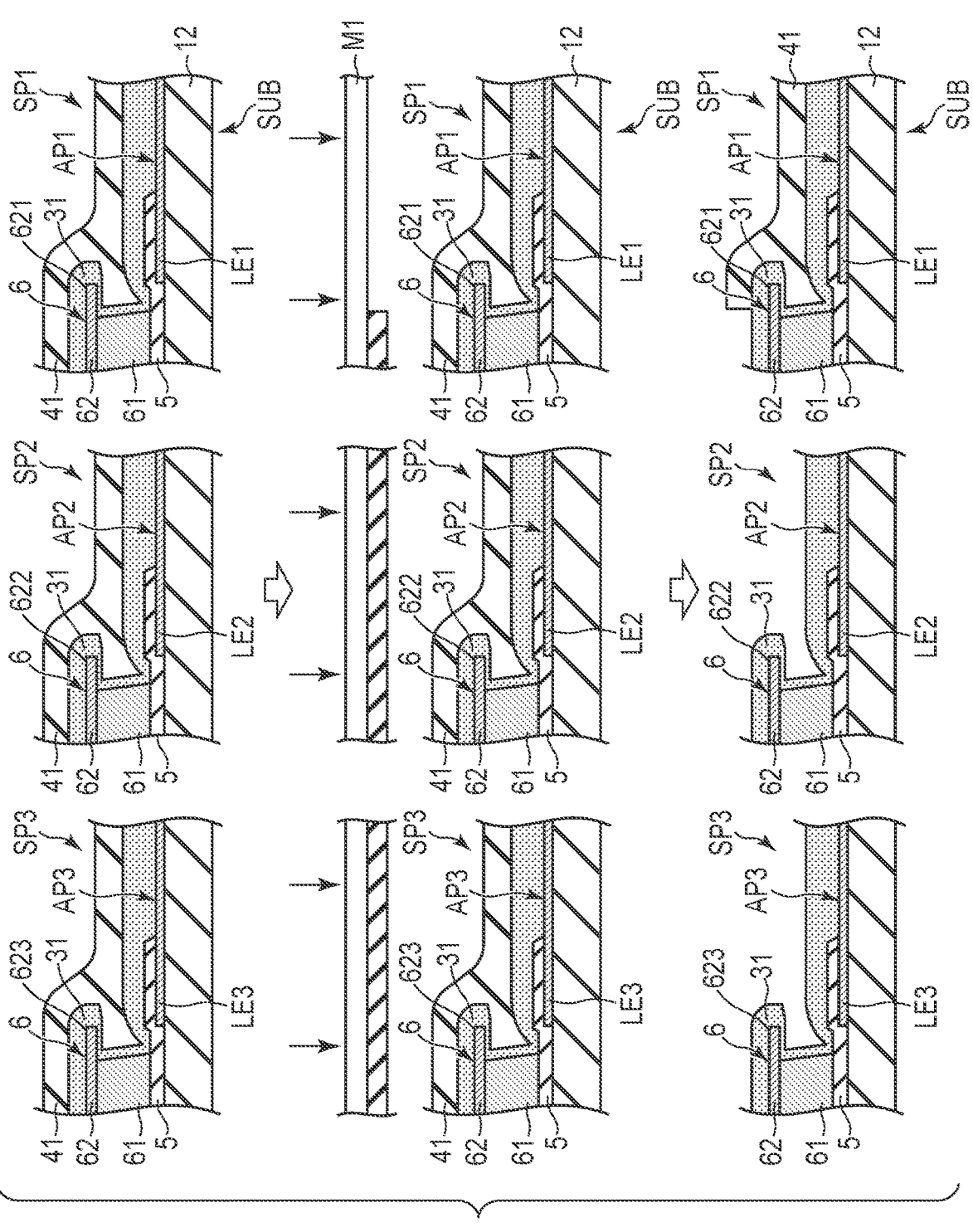
F I G. 8

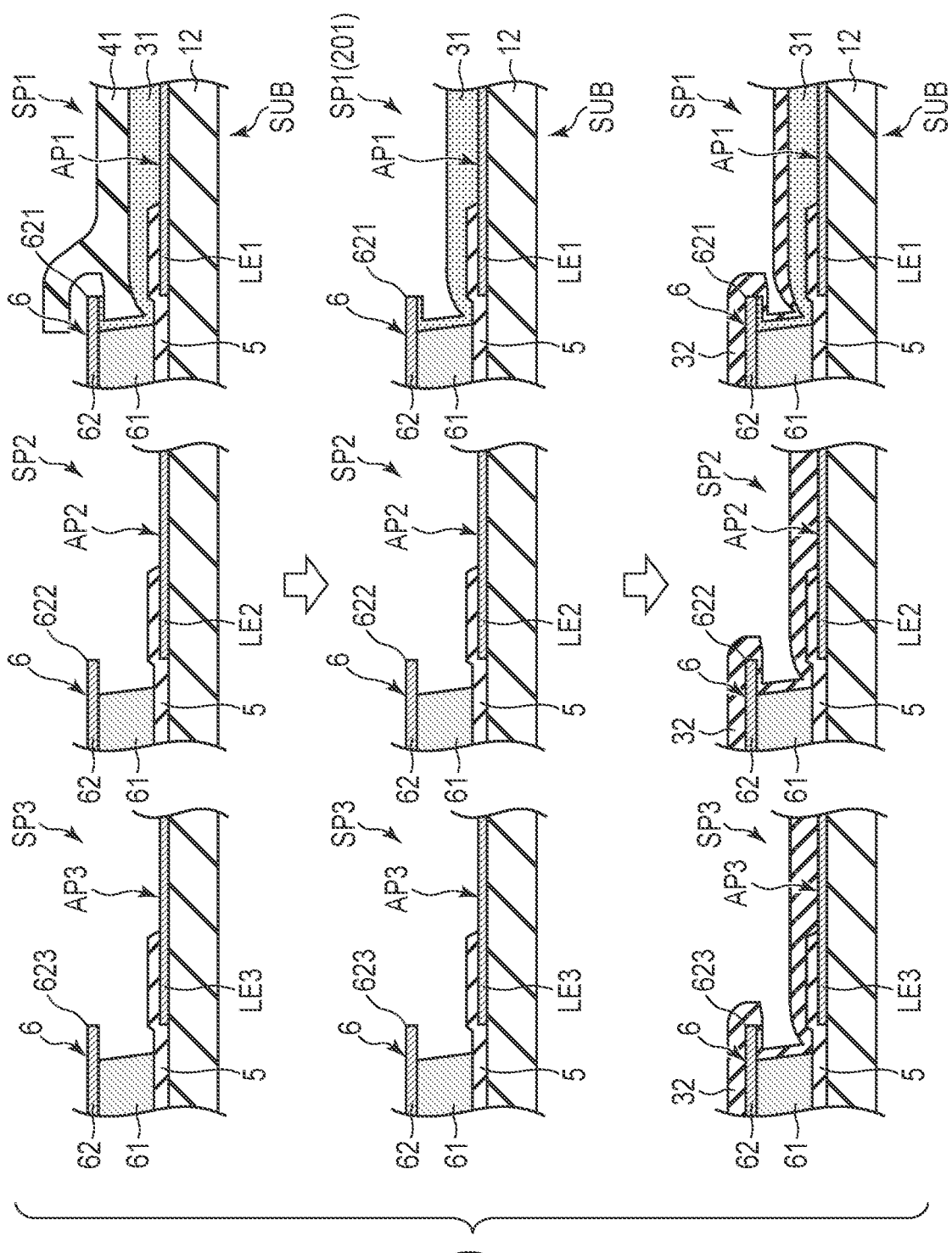
F I G. 9

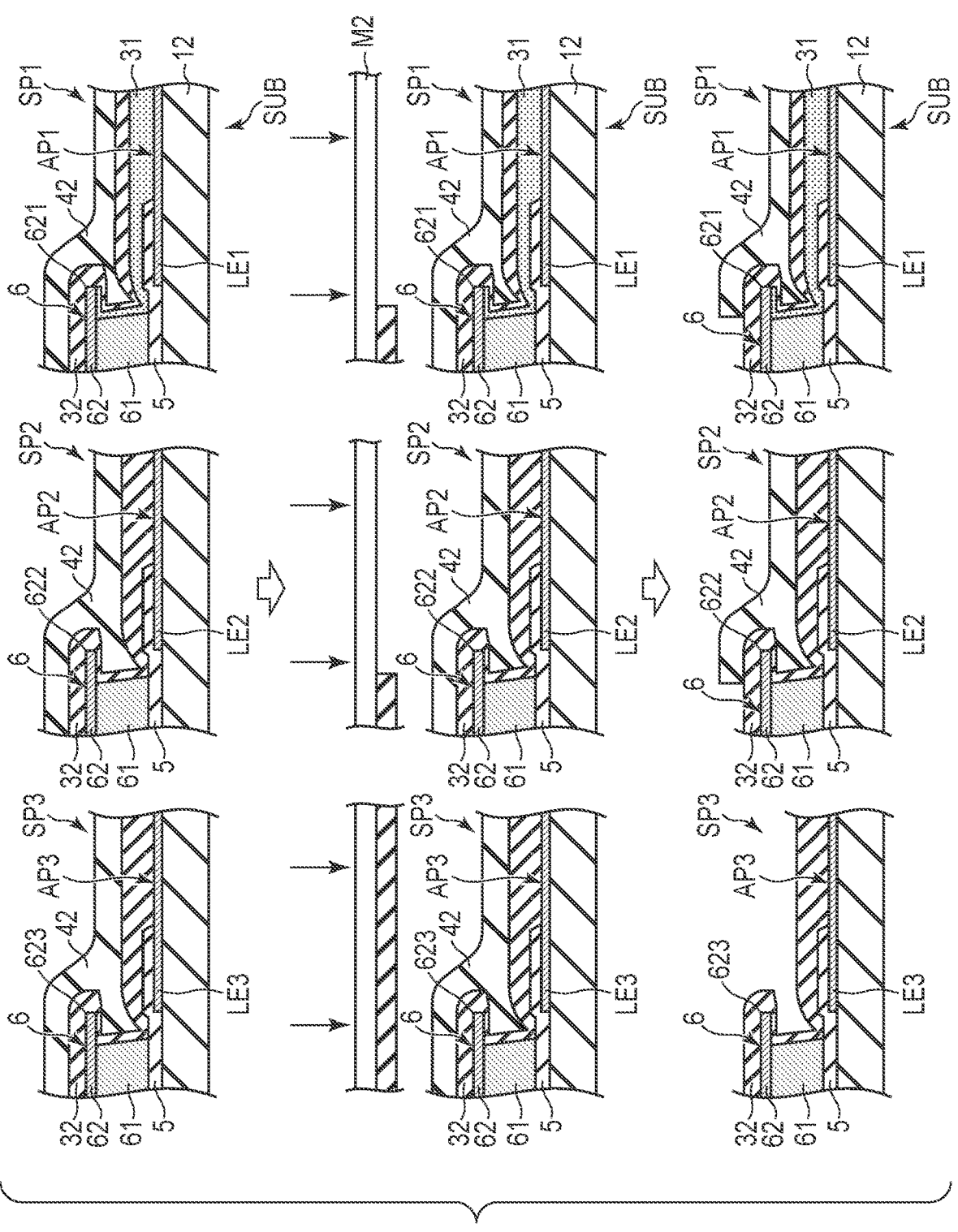
F I G. 10

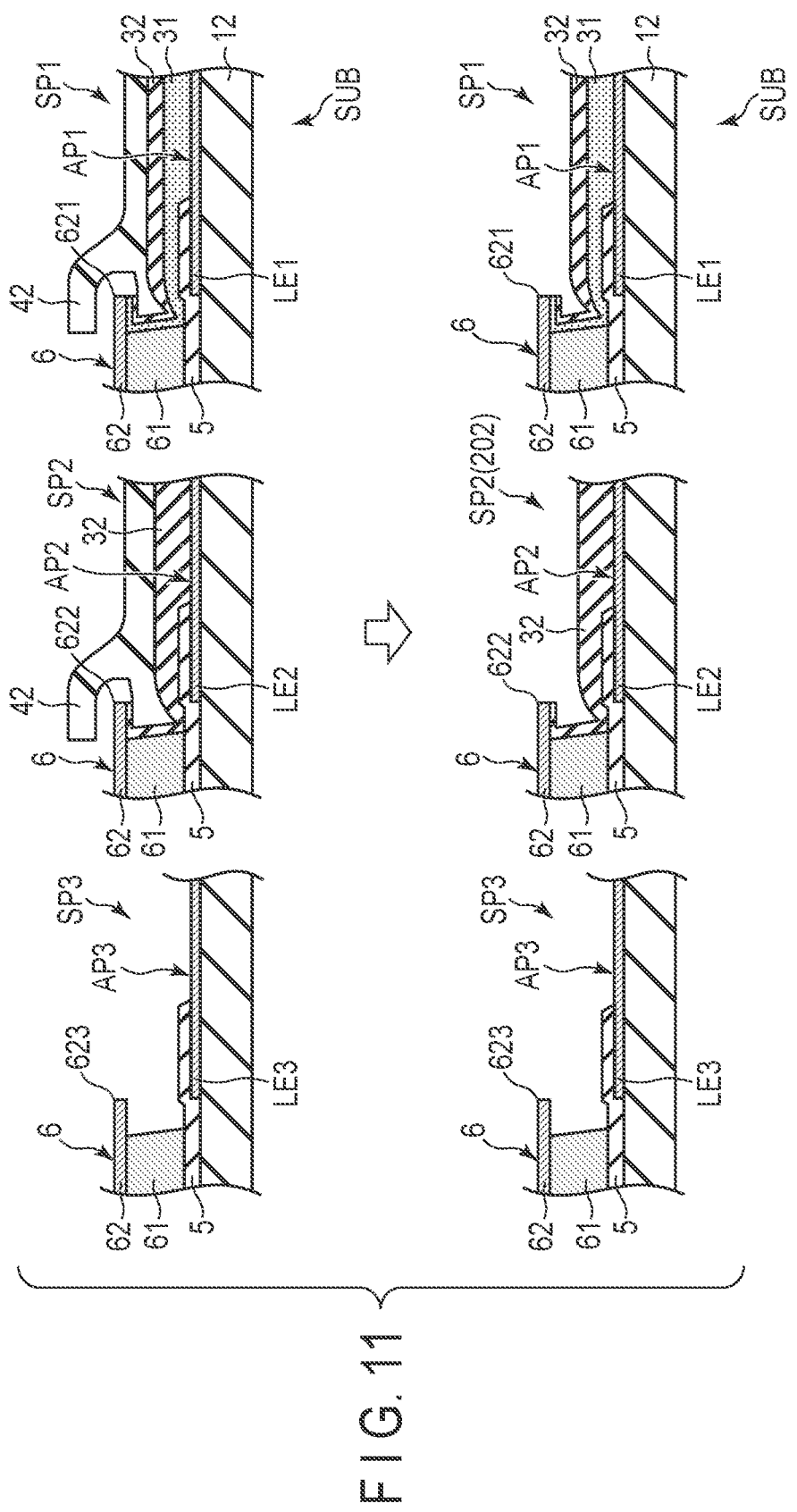
F I G. 11

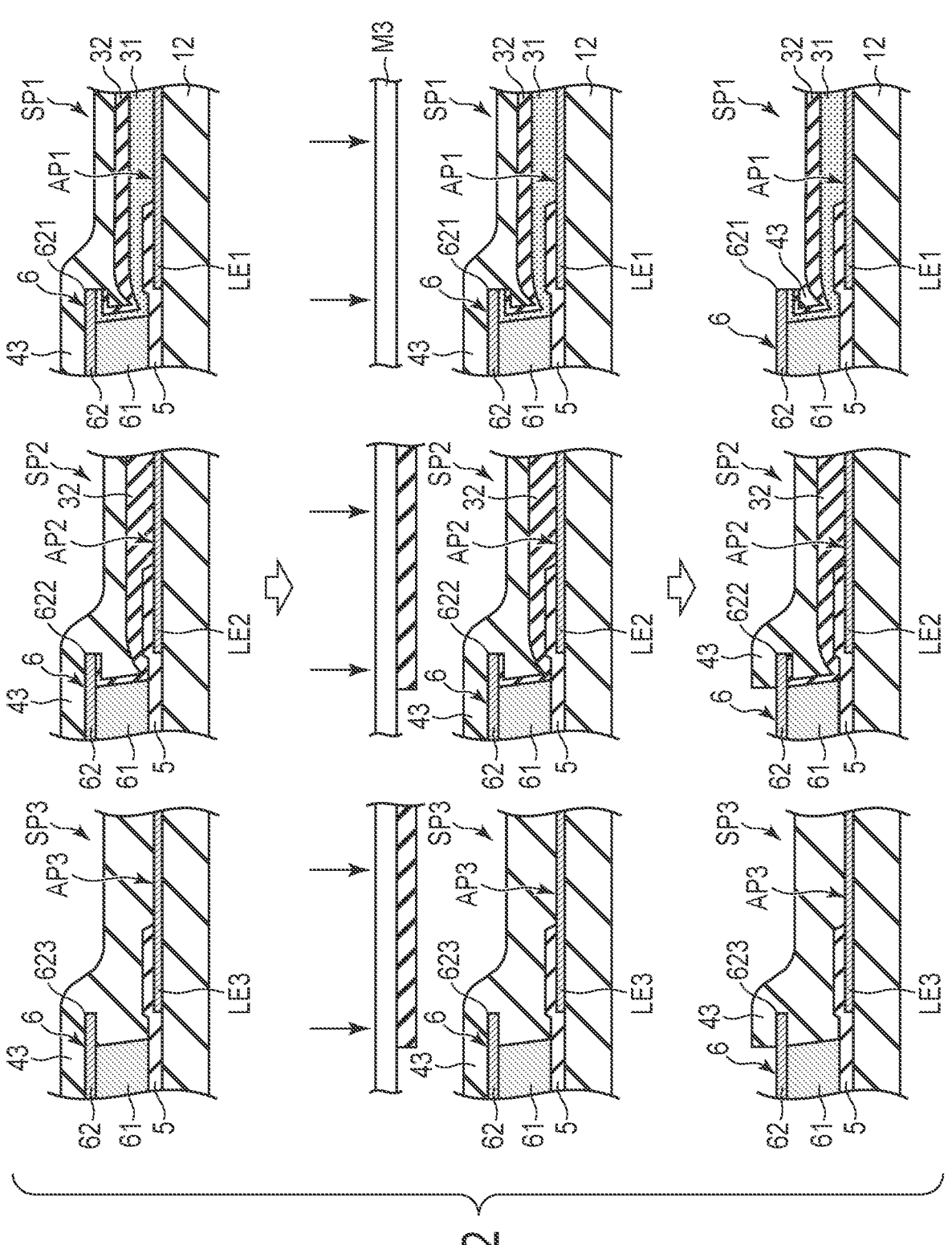
F I G. 12

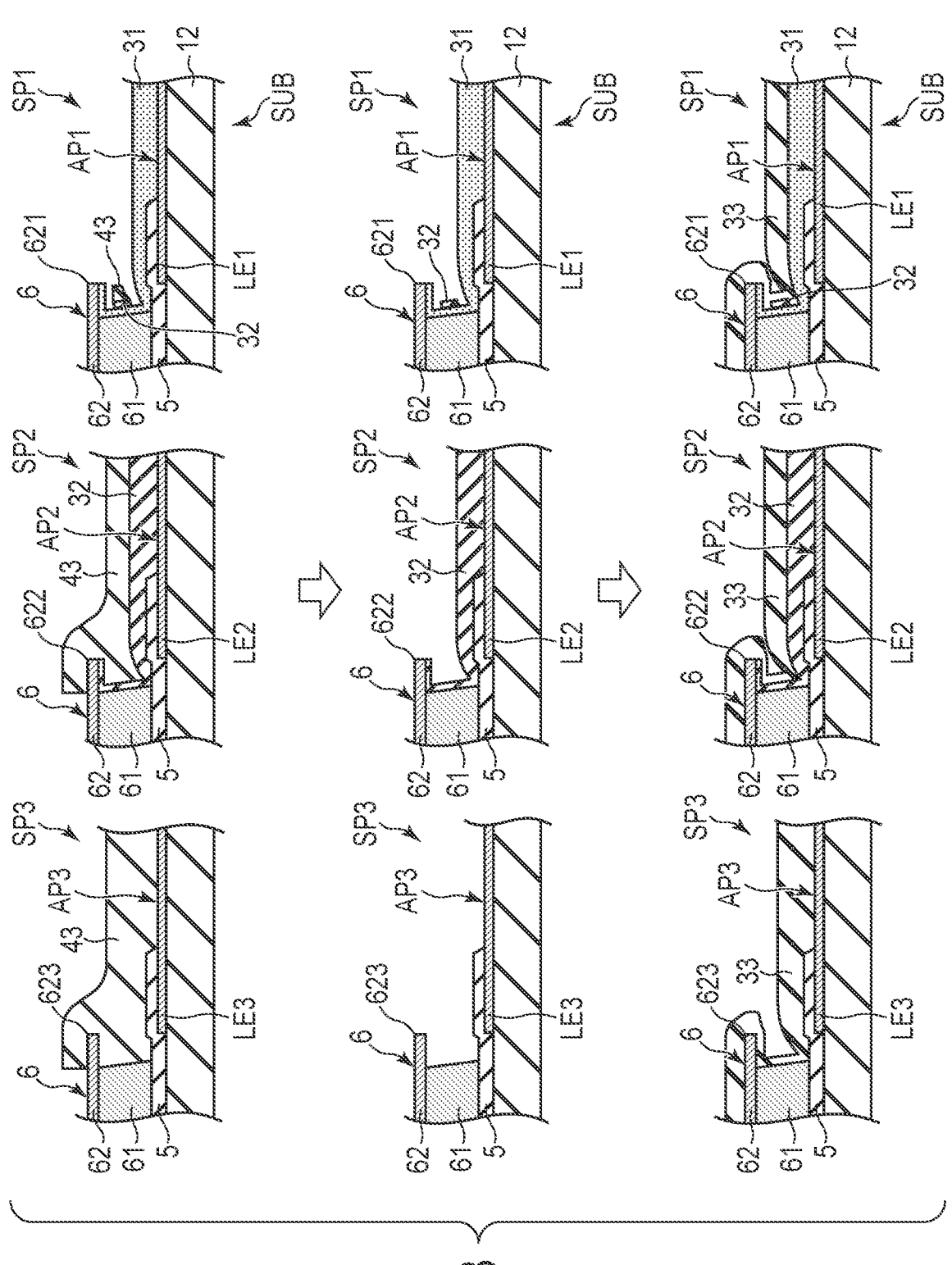
F I G. 13

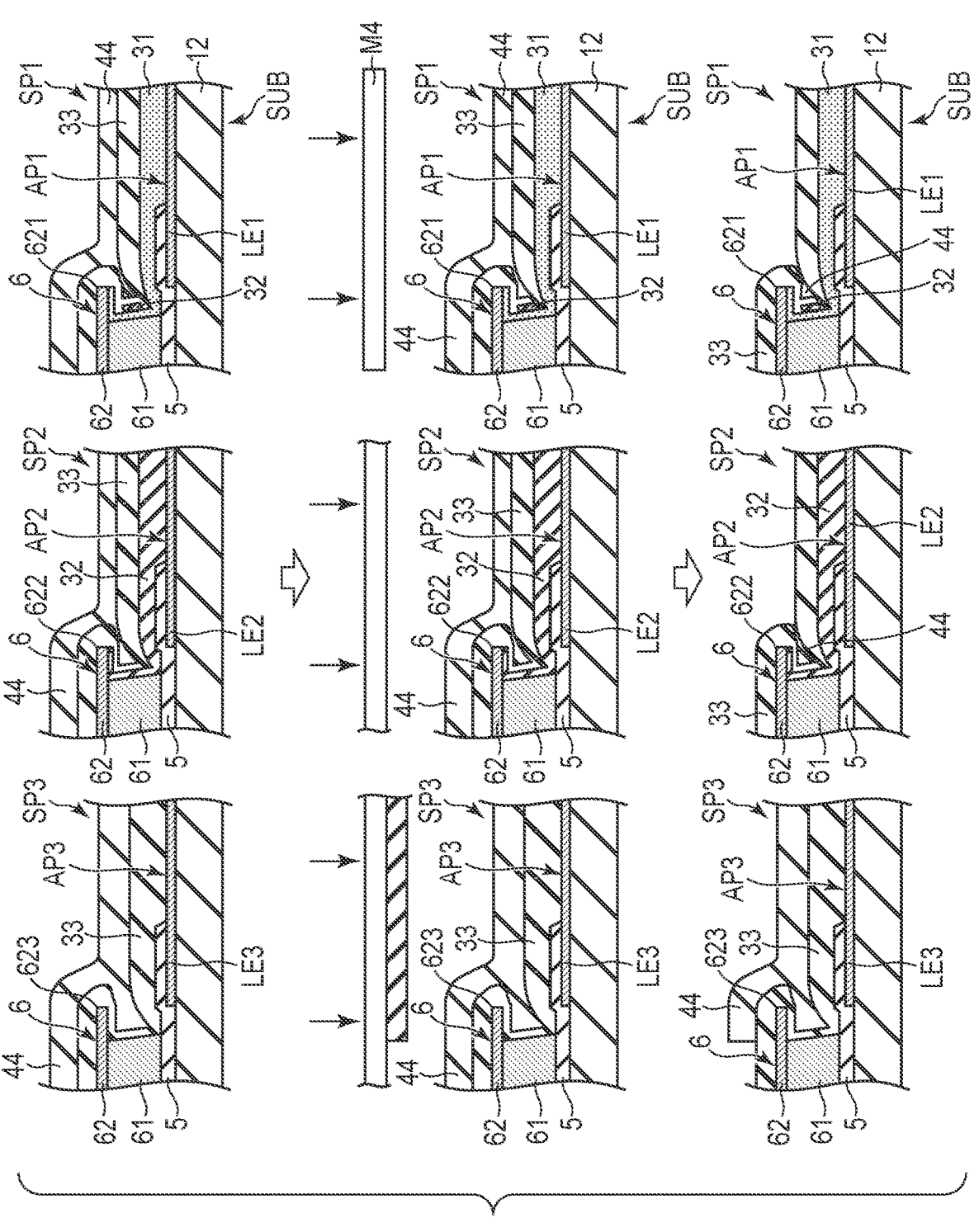
F I G. 14

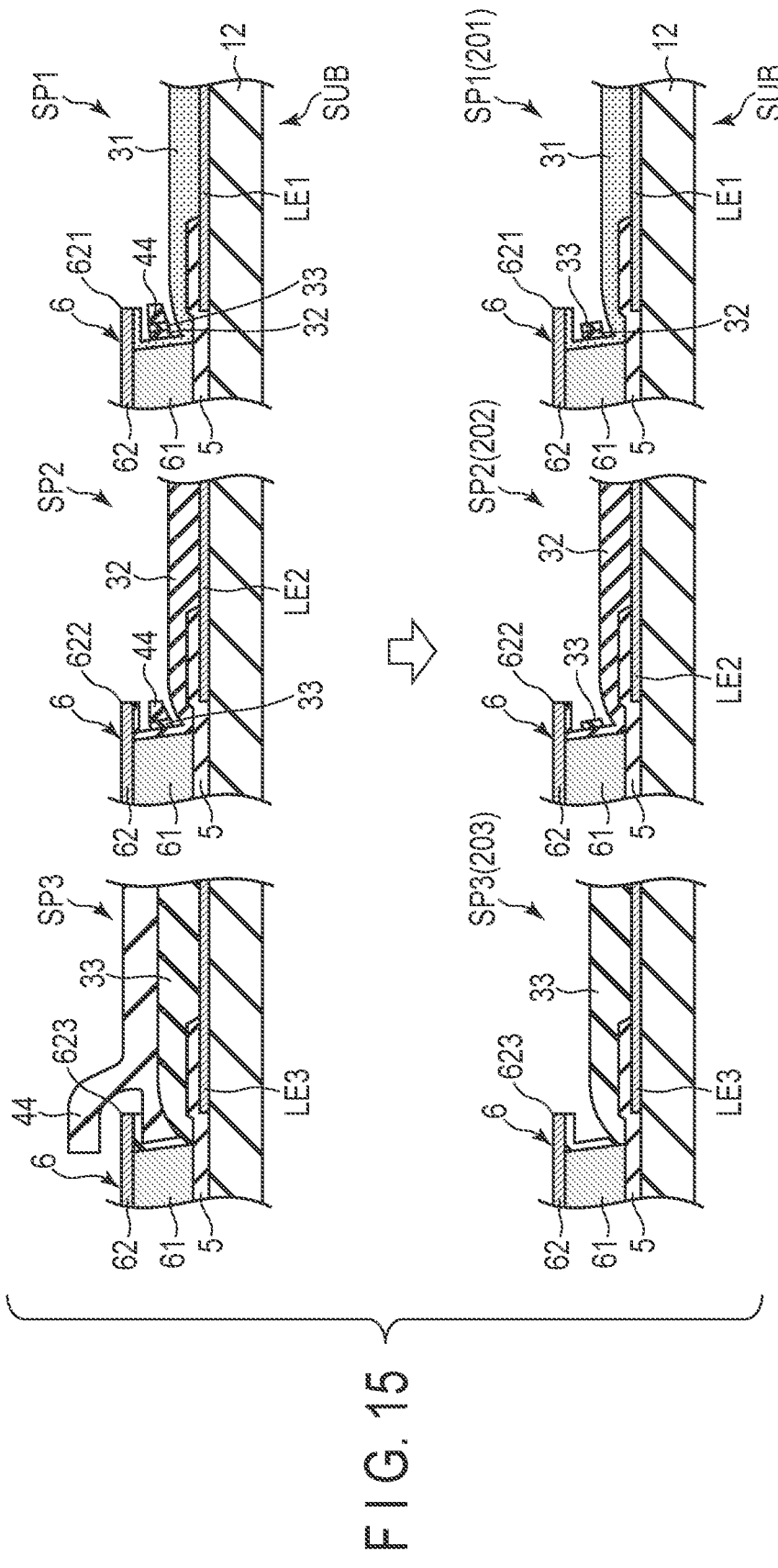
F I G. 15

DISPLAY DEVICE MANUFACTURING METHOD

CROSS-REFERENCE TO RELATED APPLICATIONS

This application is based upon and claims the benefit of priority from Japanese Patent Application No. 2022-070105, filed Apr. 21, 2022, the entire contents of which are incorporated herein by reference.

FIELD

Embodiments described herein relate generally to a display device manufacturing method.

BACKGROUND

Recently, display devices with organic light-emitting diodes (OLEDs) applied thereto as display elements have been put into practical use. This display element comprises a pixel circuit including a thin-film transistor, a lower electrode connected to the pixel circuit, an organic layer covering the lower electrode, and an upper electrode covering the organic layer. The organic layer includes functional layers such as a hole-transport layer and an electron-transport layer in addition to a light emitting layer.

A technique of suppressing reduction in reliability is required in processes of manufacturing such the display element.

BRIEF DESCRIPTION OF THE DRAWINGS

FIG. 3 is a schematic cross-sectional view showing the display device DSP taken along line III-III in FIG. 2.

FIG. 4 is a flowchart illustrating an example of the method of manufacturing the display device DSP.

FIG. 5 is a view illustrating an example of the method of manufacturing the display device DSP.

FIG. 6 is a view illustrating an example of the method of manufacturing the display device DSP.

FIG. 8 is a view illustrating an example of the method of manufacturing the display device DSP.

FIG. 9 is a view illustrating an example of the method of manufacturing the display device DSP.

FIG. 10 is a view illustrating an example of the method of manufacturing the display device DSP.

FIG. 11 is a view illustrating an example of the method of manufacturing the display device DSP.

FIG. 12 is a view illustrating an example of the method of manufacturing the display device DSP.

FIG. 13 is a view illustrating an example of the method of manufacturing the display device DSP.

FIG. 14 is a view illustrating an example of the method of manufacturing the display device DSP.

FIG. 15 is a view illustrating an example of the method of manufacturing the display device DSP.

DETAILED DESCRIPTION

Figure 1:
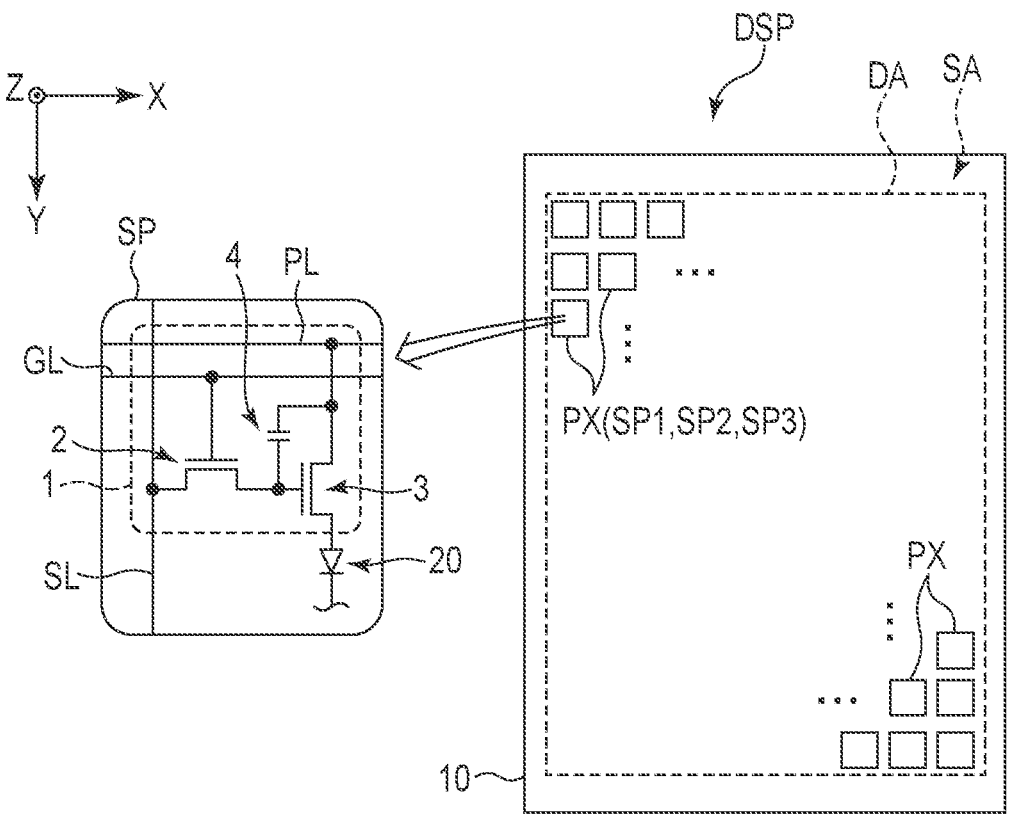
FIG. 1 is a view showing a configuration example of a display device DSP.

The embodiments described herein aim to provide a display device manufacturing method capable of suppressing the reduction in reliability.

In general, according to one embodiment, a display device manufacturing method comprises: preparing a processing substrate on which a first lower electrode of a first sub-pixel, a second lower electrode of a second sub-pixel, and a third lower electrode of a third sub-pixel are formed, and a rib including a first aperture overlapping the first lower electrode, a second aperture overlapping the second lower electrode, and a third aperture overlapping the third lower electrode is formed; forming a first thin film including a first light emitting layer over the first sub-pixel, the second sub-pixel, and the third sub-pixel; forming a negative first resist exposing the first thin film of the second sub-pixel and the third sub-pixel and covering the first thin film of the first sub-pixel; removing the first thin film of the second sub-pixel and the third sub-pixel using the first resist as a mask, leaving the first thin film in the first sub-pixel, exposing the second lower electrode from the second aperture, and exposing the third lower electrode from the third aperture; removing the first resist; forming a second thin film including a second light emitting layer over the first sub-pixel, the second sub-pixel, and the third sub-pixel; forming a negative second resist exposing the second thin film of the third sub-pixel and covering the second thin film of the first sub-pixel and the second sub-pixel; removing the second thin film of the third sub-pixel using the second resist as a mask, leaving the second thin film in the first sub-pixel and the second sub-pixel, and exposing the third lower electrode from the third aperture; removing the second resist; forming a positive third resist exposing the second thin film of the first sub-pixel, and covering the second thin film of the second sub-pixel and the third lower electrode of the third sub-pixel; removing the second thin film of the first sub-pixel using the third resist as a mask; and removing the third resist.

According to one embodiment, a display device manufacturing method capable of suppressing the reduction in reliability can be provided.

An embodiment will be described hereinafter with reference to the accompanying drawings.

The disclosure is merely an example, and proper changes in keeping with the spirit of the invention, which are easily conceivable by a person of ordinary skill in the art, come within the scope of the invention as a matter of course. In addition, in some cases, in order to make the description clearer, the widths, thicknesses, shapes, etc., of the respective parts are schematically illustrated in the drawings, compared to the actual modes. However, the schematic illustration is merely an example, and adds no restrictions to the interpretation of the invention. In addition, in the specification and drawings, structural elements which function in the same or a similar manner to those described in connection with preceding drawings are denoted by like reference numbers, detailed description thereof being omitted unless necessary.

In the figures, an X-axis, a Y-axis and a Z-axis orthogonal to each other are described to facilitate understanding as needed. A direction along the X-axis is referred to as a first direction, a direction along the Y-axis is referred to as a second direction, and a direction along the Z-axis is referred to as a third direction. Viewing various elements parallel to the third direction Z is referred to as plan view.

The display device of this embodiment is an organic electroluminescent display device comprising an organic light emitting diode (OLED) as a display element, and can be mounted on televisions, personal computers, vehicle-mounted devices, tablet terminals, smartphones, mobile phones, and the like.

FIG. 1 is a view showing a configuration example of a display device DSP.

The display device DSP has a display area DA where images are displayed and a surrounding area SA around the display area DA, on an insulating substrate 10. The substrate 10 may be glass or a flexible resin film.

In the embodiment, the shape of the substrate 10 in plan view is a rectangular shape. However, the shape of the substrate 10 in plan view is not limited to a rectangular shape, but may be any other shape such as a square, a circle or an ellipse.

The display area DA includes a plurality of pixels PX arrayed in a matrix in the first direction X and the second direction Y. Each of the pixels PX includes a plurality of sub-pixels SP. As an example, the pixel PX includes a sub-pixel SP1 of a first color, a sub-pixel SP2 of a second color, and a sub-pixel SP3 of a third color. The first, second, and third colors are colors different from each other. Incidentally, the pixel PX may include sub-pixels SP of other colors such as a white color together with the sub-pixels SP1, SP2, and SP3 or instead of any of the sub-pixels SP1, SP2, and SP3.

The sub-pixel SP comprises a pixel circuit 1 and a display element 20 driven by the pixel circuit 1. The pixel circuit 1 comprises a pixel switch 2, a drive transistor 3, and a capacitor 4. The pixel switch 2 and the drive transistor 3 are, for example, switching elements constituted by thin-film transistors.

A gate electrode of the pixel switch 2 is connected to a scanning line GL. One of a source electrode and a drain electrode of the pixel switch 2 is connected to a signal line SL, and the other is connected to a gate electrode of the drive transistor 3 and the capacitor 4. In the drive transistor 3, one of the source electrode and the drain electrode is connected to the power line PL and the capacitor 4, and the other is connected to an anode of a display element 20.

Incidentally, the configuration of the pixel circuit 1 is not limited to the example shown in the figure. For example, the pixel circuit 1 may comprise more thin-film transistors and capacitors.

The display element 20 is an organic light-emitting diode (OLED) as a light-emitting element and may be referred to as an organic EL element.

Figure 2:
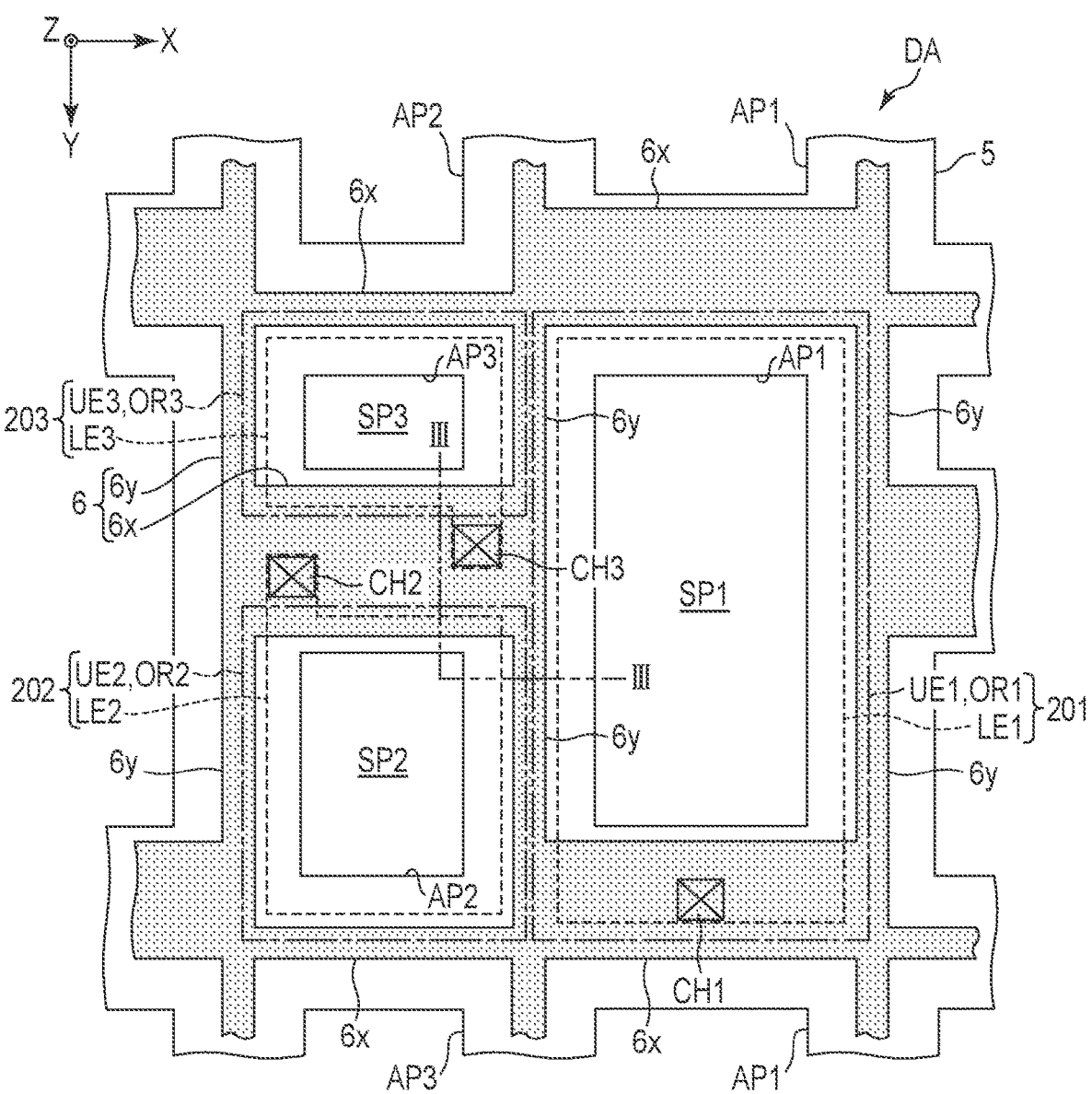
FIG. 2 is a view showing an example of a layout of the sub-pixels SP1, SP2, and SP3.

FIG. 2 is a view showing an example of a layout of the sub-pixels SP1, SP2, and SP3.

In the example of FIG. 2, the sub-pixels SP2 and SP3 are arranged in the second direction Y. Furthermore, each of the sub-pixels SP2 and SP3 is arranged with the sub-pixels SP1 in the first direction X.

When the sub-pixels SP1, SP2, and SP3 are arranged in such a layout, a column in which the sub-pixels SP2 and SP3 are alternately arranged in the second direction Y and a column in which a plurality of sub-pixels SP1 are arranged in the second direction Y are formed in the display area DA. These columns are alternately arranged in the first direction X.

Incidentally, the layout of the sub-pixels SP1, SP2, and SP3 is not limited to the example in FIG. 2. As another example, the sub-pixels SP1, SP2, and SP3 in each pixel PX may be arranged in order in the first direction X.

A rib 5 and a partition 6 are arranged in the display area DA. The rib 5 includes apertures AP1, AP2, and AP3 in the sub-pixels SP1, SP2, and SP3, respectively.

The partition 6 overlaps the rib 5 in plan view. The partition 6 includes a plurality of first partitions 6x extending in the first direction X and a plurality of second partitions 6y extending in the second direction Y. The plurality of first partitions 6x are located between the apertures AP2 and AP3 adjacent in the second direction Y and between two apertures AP1 adjacent in the second direction Y. The second partitions 6y are located between the apertures AP1 and AP2 adjacent in the first direction X and between the apertures AP1 and AP3 adjacent in the first direction X.

In the example in FIG. 2, the first partitions 6x and the second partitions 6y are connected to each other. As a result, the partition 6 is formed to have a grating pattern surrounding the apertures AP1, AP2, and AP3 as a whole. The partition 6 is considered to include apertures at the sub-pixels SP1, SP2, and SP3, similarly to the rib 5.

The sub-pixels SP1, SP2, and SP3 comprise display elements 201, 202, and 203 as display elements 20, respectively.

The sub-pixel SP1 comprises a lower electrode LE1, an upper electrode UE1, and an organic layer OR1 each overlapping the aperture AP1. The sub-pixel SP2 comprises a lower electrode LE2, an upper electrode UE2, and an organic layer OR2 each overlapping the aperture AP2. The sub-pixel SP3 comprises a lower electrode LE3, an upper electrode UE3, and an organic layer OR3 each overlapping the aperture AP3.

In the example in FIG. 2, outlines of the lower electrodes LE1, LE2, and LE3 are represented by dotted lines, and outlines of the organic layers OR1, OR2, and OR3 and the upper electrodes UE1, UE2, and UE3 are represented as one-dot chain lines. A peripheral portion of each of the lower electrodes LE1, LE2, and LE3 overlaps the rib 5. The outlines of the respective lower electrode, organic layer, and upper electrode shown in the figure may not reflect the exact shapes.

The lower electrode LE1, the upper electrode UE1, and the organic layer OR1 constitute the display element 201 of the sub-pixel SP1. The lower electrode LE2, the upper electrode UE2, and the organic layer OR2 constitute the display element 202 of the sub-pixel SP2. The lower electrode LE3, the upper electrode UE3, and the organic layer OR3 constitute the display element 203 of the sub-pixel SP3.

For example, the lower electrodes LE1, LE2, and LE3 correspond to the anodes of the display elements. The upper electrodes UE1, UE2, and UE3 correspond to the cathodes of the display elements or common electrodes.

The lower electrode LE1 is connected to the pixel circuit 1 of the sub-pixel SP1 (see FIG. 1) through a contact hole CH1. The lower electrode LE2 is connected to the pixel circuit 1 of the sub-pixel SP2 through a contact hole CH2. The lower electrode LE3 is connected to the pixel circuit 1 of the sub-pixel SP3 through a contact hole CH3.

In the example shown in FIG. 2, the area of the aperture AP1 is larger than that of the aperture AP2, and the area of the aperture AP2 is larger than that of the aperture AP3. In other words, the area of the lower electrode LE1 exposed through the aperture AP1 is larger than the area of the lower electrode LE2 exposed through the aperture AP2, and the area of the lower electrode LE2 exposed through the aperture AP2 is larger than the area of the lower electrode LE3 exposed through the aperture AP3.

For example, the display element 201 of the sub-pixel SP1 is configured to emit light in the blue wavelength range. In addition, the display element 202 of the sub-pixel SP2 is configured to emit light in the green wavelength range, and the display element 203 of the sub-pixel SP3 is configured to emit light in the red wavelength range.

FIG. 3 is a schematic cross-sectional view showing the display device DSP taken along line III-III in FIG. 2.

A circuit layer 11 is arranged on the above-described substrate 10. The circuit layer 11 includes various circuits such as the pixel circuits 1, and various lines such as the scanning lines GL, the signal lines SL and the power lines PL shown in FIG. 1. The circuit layer 11 is covered with an insulating layer 12. The insulating layer 12 functions as a planarization film for planarizing uneven parts generated by the circuit layer 11.

The lower electrodes LE1, LE2, and LE3 are arranged on the insulating layer 12. The rib 5 is arranged on the insulating layer 12 and the lower electrodes LE1, LE 2, and LE3. End parts of the lower electrodes LE1, LE2, and LE3 are covered with the rib 5. In other words, the end parts of the lower electrodes LE1, LE2, LE3 are located between the insulating layer 12 and the rib 5. The insulating layer 12 is covered with the rib 5 at a position between adjacent lower electrodes of the lower electrodes LE1, LE2, and LE3.

The partition 6 includes a lower portion (stem) 61 arranged on the rib 5 and an upper portion (shade) 62 arranged on the lower portion 61. The lower portion 61 of the partition 6 shown on the right side of the figure is located between the apertures AP1 and AP2. The lower portion 61 of the partition 6 shown on the left side of the figure is located between the apertures AP2 and AP3. The upper portion 62 has a width greater than the lower portion 61. As a result, both the end parts of the upper portion 62 protrude from the side surfaces of the lower portion 61 in FIG. 3. The shape of the partition 6 may also be referred to as an overhanging shape. A part of the upper portion 62, which further protrudes toward the aperture AP1 than the lower portion 61 is referred to as a protrusion 621, a part which further protrudes toward the aperture AP2 than the lower portion 61 is referred to as a protrusion 622, and a part which further protrudes toward the aperture AP3 than the lower portion 61 is referred to as a protrusion 623.

The organic layer OR1 is in contact with the lower electrode LE1 through the aperture AP1, covers the lower electrode LE1, and partially overlaps the rib 5. The upper electrode UE1 is opposed to the lower electrode LE1 and arranged on the organic layer OR1. Furthermore, the upper electrode UE1 is in contact with side surfaces of the lower portion 61. The organic layer OR1 and the upper electrode UE1 are located below the upper portion 62.

The organic layer OR2 is in contact with the lower electrode LE2 through the aperture AP2, covers the lower electrode LE2, and partially overlaps the rib 5. The upper electrode UE2 is opposed to the lower electrode LE2 and arranged on the organic layer OR2. Furthermore, the upper electrode UE2 is in contact with the side surfaces of the lower portion 61. The organic layer OR2 and the upper electrode UE2 are located below the upper portion 62.

The organic layer OR3 is in contact with the lower electrode LE3 through the aperture AP3, covers the lower electrode LE3, and partially overlaps the rib 5. The upper electrode UE3 is opposed to the lower electrode LE3 and arranged on the organic layer OR3. Furthermore, the upper electrode UE3 is in contact with the side surfaces of the lower portion 61. The organic layer OR3 and the upper electrode UE3 are located below the upper portion 62.

In the example of FIG. 3, the sub-pixels SP1, SP2, and SP3 include cap layers (optical adjustment layers) CP1, CP2, and CP3 for adjusting the optical characteristics of the light emitted from the light emitting layers of the organic layers OR1, OR2, and OR3.

The cap layer CP1 is located in the aperture AP1, located below the upper portion 62, and arranged on the upper electrode UE1. The cap layer CP2 is located in the aperture AP2, located below the upper portion 62, and arranged on the upper electrode UE2. The cap layer CP3 is located in the aperture AP3, located below the upper portion 62, and arranged on the upper electrode UE3.

Sealing layers SE1, SE2, and SE3 are arranged in the sub-pixels SP1, SP2, and SP3, respectively.

The sealing layer SE1 is in contact with the cap layer CP1, and the lower portion 61 and the upper portion 62 of the partition 6, and continuously covers members of the sub-pixel SP1. The sealing layer SE2 is in contact with the cap layer CP2, and the lower portion 61 and the upper portion 62 of the partition 6, and continuously covers members of the sub-pixel SP2. The sealing layer SE3 is in contact with the cap layer CP3, and the lower portion 61 and the upper portion 62 of the partition 6, and continuously covers members of the sub-pixel SP3.

The sealing layers SE1, SE2, and SE3 are covered with a protective layer 13.

In the example in FIG. 3, none of the organic layers, the upper electrodes, the cap layers, and the sealing layers are arranged on the partition 6, but some of these layers may be arranged. For example, when a part of the organic layer is arranged on the partition 6, a part below the upper portion 62 and a part arranged on the upper portion 62, of the organic layer, are separated from each other. When a part of the upper electrode is arranged on the partition 6, a part below the upper portion 62 and a part arranged on the upper portion 62, of the upper electrode, are separated from each other. When a part of the cap layer is arranged on the partition 6, a part below the upper portion 62 and a part arranged on the upper portion 62, of the cap layer, are separated from each other. On the partition 6 between the sub-pixels SP1 and SP2, the organic layer OR1 is separated from the organic layer OR2, the upper electrode UE1 is separated from the upper electrode UE2, the cap layer CP1 is separated from the cap layer CP2, and the sealing layer SE1 is separated from the sealing layer SE2. On the partition 6 between the sub-pixels SP2 and SP3, the organic layer OR2 is separated from the organic layer OR3, the upper electrode UE2 is separated from the upper electrode UE3, the cap layer CP2 is separated from the cap layer CP3, and the sealing layer SE2 is separated from the sealing layer SE3.

The insulating layer 12 is an organic insulating layer. The rib 5 and the sealing layers SE1, SE2, and SE3 are inorganic insulating layers.

The sealing layers SE1, SE2, and SE3 are formed of, for example, the same inorganic insulating material.

The rib 5 is formed of silicon nitride (SiNx), which is an example of an inorganic insulating material. Incidentally, the rib 5 may be formed as a single-layer body of any one of silicon oxide (SiOx), silicon oxynitride (SiON) and aluminum oxide ($Al_2O_3$) as the other inorganic insulating material. Alternatively, the rib 5 may be formed as a stacked layer body formed of combination of at least two of a silicon nitride layer, a silicon oxide layer, a silicon oxynitride layer, and an aluminum oxide layer.

The sealing layers SE1, SE2, and SE3 are formed of silicon nitride (SiNx), which is an example of an inorganic insulating material. The sealing layers SE1, SE2, and SE3 may be formed as single-layer bodies of any one of silicon oxide (SiOx), silicon oxynitride (SiON) and aluminum oxide ($Al_2O_3$) as the other inorganic insulating material. Alternatively, the sealing layers SE1, SE2, and SE3 may be formed as stacked layer bodies formed of combination of at least two of a silicon nitride layer, a silicon oxide layer, a silicon oxynitride layer, and an aluminum oxide layer. For this reason, the sealing layers SE1, SE2, and SE3 may be formed of the same material as that of the rib 5.

The lower portion 61 of the partition 6 is formed of a conductive material and is electrically connected to each of the upper electrodes UE1, UE2, and UE3. Both the lower portion 61 and the upper portion 62 of the partition 6 may be conductive. The upper portion 62 is formed of a light-shielding material.

The thickness of the rib 5 is sufficiently small as compared to the thickness of the partition 6 and the insulating layer 12. In one example, the thickness of the rib 5 is 200 nm or more and 400 nm or less.

The thickness of the lower portion 61 of the partition 6 (thickness from the upper surface of the rib 5 to the lower surface of the upper portion 62) is greater than the thickness of the rib 5.

The thickness of the sealing layer SE1, the thickness of the sealing layer SE2, and the thickness of the sealing layer SE3 are substantially equal to each other.

The silicon nitride has a property of slightly absorbing the blue wavelength (in the wavelength range of 450 nm or less). Therefore, when the sealing layers SE1, SE2, and SE3 are formed of silicon nitride, the thickness of the sealing layers SE1, SE2, and SE3 is desirably small enough to ensure the sealing performance, for example, 2 μm or less. The transmittance of the blue wavelength is thereby improved.

In contrast, when the thickness of the sealing layers SE1, SE2, and SE3 is made small, voids may be formed below the protrusions 621, 622, and 623.

The lower electrodes LE1, LE2, and LE3 may be formed of a transparent conductive material such as ITO and may have a multilayer structure of a metallic material such as silver (Ag) and a transparent conductive material. The upper electrodes UE1, UE2, and UE3 are formed of, for example, a metallic material such as an alloy (MgAg) of magnesium and silver. The upper electrodes UE1, UE2, and UE3 may be formed of a transparent conductive material such as ITO.

Each of the organic layers OR1, OR2, and OR3 includes a plurality of functional layers such as a hole-injection layer, a hole-transport layer, an electron blocking layer, a hole blocking layer, an electron-transport layer, and an electron-injection layer. In addition, the organic layer OR1 includes a light emitting layer EM1. The organic layer OR2 includes a light emitting layer EM2. The light emitting layer EM2 is formed of a material different from the light emitting layer EM1. The organic layer OR3 includes a light emitting layer EM3. The light emitting layer EM3 is formed of a material different from that of the light emitting layers EM1 and EM2.

The material forming the light emitting layer EM1, the material forming the light emitting layer EM2, and the material forming the light emitting layer EM3 are materials that emit light in wavelength ranges different from each other.

In one example, the light emitting layer EM1 is formed of a material which emits light in the blue wavelength range, the light emitting layer EM2 is formed of a material which emits light in the green wavelength range, and the light emitting layer EM3 is formed of a material which emits light in the red wavelength range.

The cap layers CP1, CP2, and CP3 are formed of, for example, multilayer bodies of transparent thin films. The multilayer body may include a thin film formed of an inorganic material and a thin film formed of an organic material, as the thin films. In addition, the plurality of thin films have refractive indexes different from each other. The materials of the thin films constituting the multilayer bodies are different from the materials of the upper electrodes UE1, UE2, and UE3 and also different from the materials of the sealing layers SE1, SE2, and SE3. Incidentally, the cap layers CP1, CP2, and CP3 may be omitted.

The protective layer 13 is formed of a multilayer body of transparent thin films and includes, for example, a thin film formed of inorganic materials and a thin film formed of organic materials, as the thin films.

A common voltage is supplied to the partition 6. This common voltage is supplied to each of the upper electrodes UE1, UE2, and UE3 which are in contact with the side surfaces of the lower portion 61. A pixel voltage is supplied to the lower electrodes LE1, LE2, and LE3 through the pixel circuits 1 included in the respective sub-pixels SP1, SP2, and SP3.

When a potential difference is formed between the lower electrode LE1 and the upper electrode UE1, the light emitting layer EM1 of the organic layer OR1 emits light in the first wavelength range. When a potential difference is formed between the lower electrode LE2 and the upper electrode UE2, the light emitting layer EM2 of the organic layer OR2 emits light in the second wavelength range. When a potential difference is formed between the lower electrode LE3 and the upper electrode UE3, the light emitting layer EM3 of the organic layer OR3 emits light in the third wavelength range.

Next, an example of a method of manufacturing the display device DSP will be described.

FIG. 4 is a flowchart illustrating an example of the method of manufacturing the display device DSP.

The manufacturing method illustrated here roughly includes a process of preparing a processing substrate SUB including the sub-pixels SP1, SP2, and SP3 (step ST1), a process of forming the display element 201 of the sub-pixel SP1 (step ST2), a process of forming the display element 202 of the sub-pixel SP2 (step ST3), and a process of forming the display element 203 of the sub-pixel SP3 (step ST4).

In step ST1, first, the processing substrate SUB in which the lower electrode LE1 of the sub-pixel SP1, the lower electrode LE2 of the sub-pixel SP2, the lower electrode LE3 of the sub-pixel SP3, the rib 5, and the partition 6 are formed, on the substrate 10, is prepared. As shown in FIG. 3, the circuit layer 11 and the insulating layer 12 are also formed between the substrate 10 and the lower electrodes LE1, LE2, and LE3.

In step ST2, first, the first thin film 31 including the light emitting layer EM1 is formed over the sub-pixel SP1, the sub-pixel SP2, and the sub-pixel SP3 (step ST21). After that, a negative first resist 41 patterned in a predetermined shape is formed on the first thin film 31 (step ST22). The first resist 41 exposes the first thin film 31 of the sub-pixel SP2 and the sub-pixel SP3, and covers the first thin film 31 of the sub-pixel SP1.

After that, the first thin film 31 of the sub-pixel SP2 and the sub-pixel SP3 is removed by etching using the first resist 41 as a mask (step ST23). The first thin film 31 remains in the sub-pixel SP1. After that, the first resist 41 is removed (step ST24). The sub-pixel SP1 is thereby formed. The sub-pixel SP1 comprises the display element 201 including the first thin film 31 in a predetermined shape.

In step ST3, first, the second thin film 32 including the light emitting layer EM2 is formed over the sub-pixel SP1, the sub-pixel SP2, and the sub-pixel SP3 (step ST31). After that, a negative second resist 42 patterned in a predetermined shape is formed on the second thin film 32 (step ST32). The second resist 42 exposes the second thin film 32 of the sub-pixel SP3 and covers the second thin film 32 of the sub-pixel SP1 and the sub-pixel SP2.

After that, the second thin film 32 of the sub-pixel SP3 is removed by etching using the second resist 42 as a mask (step ST33). The second thin film 32 remains in the sub-pixel SP1 and the sub-pixel SP2. After that, the second resist 42 is removed (step ST34).

After that, a positive third resist 43 patterned in a predetermined shape is formed (step ST35). The third resist 43 exposes the second thin film 32 of the sub-pixel SP1, covers the second thin film 32 of the sub-pixel SP2, and covers the lower electrode LE3 of the sub-pixel SP3.

After that, the second thin film 32 of the sub-pixel SP1 is removed by etching using the third resist 43 as a mask (step ST36). The first thin film 31 remains in the sub-pixel SP1, and the second thin film 32 remains in the sub-pixel SP2. After that, the third resist 43 is removed (step ST37). The sub-pixel SP2 is thereby formed. The sub-pixel SP2 comprises the display element 202 including the second thin film 32 in a predetermined shape.

In step ST4, first, the third thin film 33 including the light emitting layer EM3 is formed over the sub-pixel SP1, the sub-pixel SP2, and the sub-pixel SP3 (step ST41). After that, a positive fourth resist 44 patterned in a predetermined shape is formed on the third thin film 33 (step ST42). The fourth resist 44 exposes the third thin films 33 of the sub-pixel SP1 and the sub-pixel SP2, and covers the third thin film 33 of the sub-pixel SP3.

After that, the third thin film 33 of the sub-pixel SP1 and the sub-pixel SP2 is removed by etching using the fourth resist 44 as a mask (step ST43). The third thin film 33 remains in the sub-pixel SP3. After that, the fourth resist 44 is removed (step ST44). The sub-pixel SP3 is thereby formed. The sub-pixel SP3 comprises the display element 203 including the third thin film 33 in a predetermined shape.

A negative type resist is a material which is insoluble in a developing solution when exposed, while a positive type resist is a material which dissolves in the developing solution when exposed.

Step ST1 to step ST4 will be described below with reference to FIG. 5 to FIG. 15.

First, in step ST1, the processing substrate SUB is prepared as shown in FIG. 5. A process of preparing the processing substrate SUB includes a process of forming the circuit layer 11 on the substrate 10, a process of forming the insulating layer 12 on the circuit layer 11, a process of forming the lower electrode LE1 of the sub-pixel SP1, the lower electrode LE2 of the sub-pixel SP2, and the lower electrode LE3 of the sub-pixel SP3 on the insulating layer 12, a process of forming the rib 5 including the apertures AP1, AP2, and AP3 which overlap the lower electrodes LE1, LE2, and LE3, respectively, and a process of forming the partition 6 including the lower portion 61 arranged on the rib 5 and the upper portion 62 arranged on the lower portion 61 and protruding from the side surfaces of the lower portion 61. In FIG. 6 to FIG. 15, illustration of the substrate 10 and the circuit layer 11 lower than the insulating layer 12 is omitted.

Then, in step ST21, as shown in FIG. 6, the first thin film 31 is formed over the sub-pixel SP1, the sub-pixel SP2, and the sub-pixel SP3. The first thin film 31 overlaps the lower electrode LE1 in the aperture AP1 of the sub-pixel SP1, overlaps the lower electrode LE2 in the aperture AP2 of the sub-pixel SP2, overlaps the lower electrode LE3 in the aperture AP3 of the sub-pixel SP3, overlaps the rib 5, and covers the lower portion 61 and the upper portion 62 of the partition 6.

Figure 7:
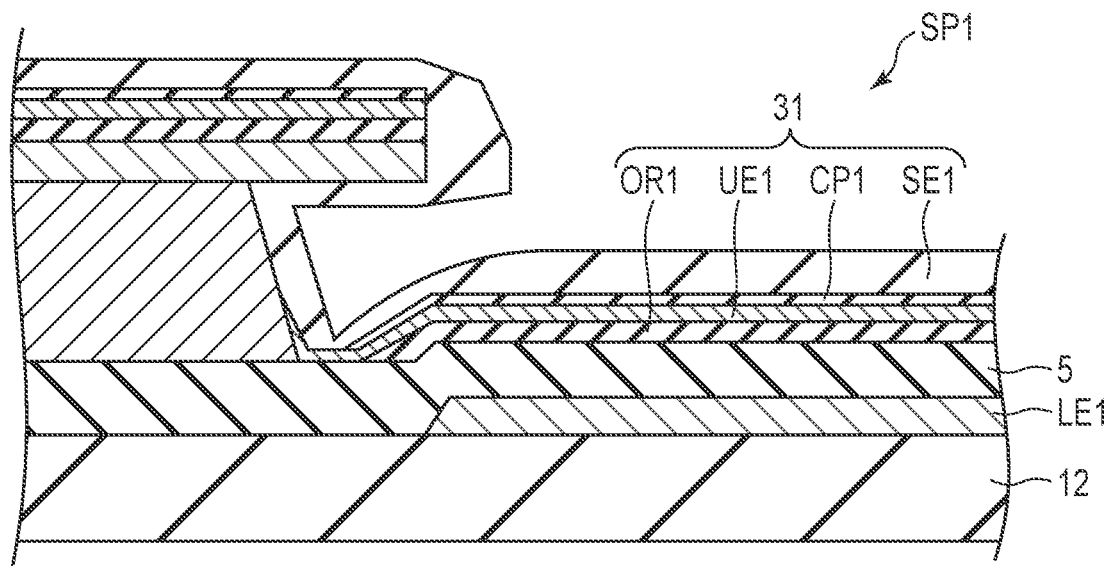
FIG. 7 is an enlarged cross-sectional view showing the first thin film 31 arranged in the sub-pixel SP1.

FIG. 7 is an enlarged cross-sectional view showing the first thin film 31 arranged in the sub-pixel SP1.

The first thin film 31 includes an organic layer OR1 including a light emitting layer EM1 which emits light in the blue wavelength range, an upper electrode UE1 arranged on the organic layer OR1, a cap layer CP1 arranged on the upper electrode UE1, and a sealing layer SE1 arranged on the cap layer CP1. The first thin film 31 arranged on the sub-pixel SP2 and the sub-pixel SP3 is also formed in the same manner as the first thin film shown in FIG. 7.

Then, in step ST22, the first resist 41 is formed on the first thin film 31 as shown in FIG. 8.

First, the first resist 41 is applied over the entire surface on the first thin film 31 as shown in an upper part of FIG. 8. At this time, the first resist 41 is embedded in the voids of the first thin film 31 formed below the protrusions 621, 622, and 623.

After that, as shown in the middle part of FIG. 8, the first resist 41 is exposed by applying a photomask M1 having a predetermined aperture pattern. As described above, the first resist 41 is a negative resist. A photomask M1 having an aperture pattern corresponding to the sub-pixel SP1 is applied. As a result, the first resist 41 of the sub-pixel SP1 is exposed, while the first resist 41 of the sub-pixel SP2 and the sub-pixel SP3 is not exposed.

After that, as shown in the lower part of FIG. 8, the first resist 41 is cured after the first resist 41 is developed. As a result, the first resist 41 covers the first thin film 31 of the sub-pixel SP1 and exposes the first thin film 31 of the sub-pixel SP2 and the sub-pixel SP3. In addition, the first resist 41 remains in the void below the protrusion 621 and is removed from the voids below the protrusions 622 and 623.

Then, in step ST23, as shown in the upper part of FIG. 9, etching is performed using the first resist 41 as a mask to remove the first thin film 31 of the sub-pixel SP2 and the sub-pixel SP3 exposed from the first resist 41, and the first thin film 31 remains in the sub-pixel SP1. In other words, the sealing layer SE1, the cap layer CP1, the upper electrode UE1, and the organic layer OR1 in the sub-pixel SP2 and the sub-pixel SP3 are removed. As a result, the lower electrode LE2 is exposed through the aperture AP2 in the sub-pixel SP2, and the rib 5 surrounding the lower electrode LE2 is also exposed. In addition the lower electrode LE3 is exposed through the aperture AP3 in the sub-pixel SP3, and the rib 5 surrounding the lower electrode LE3 is also exposed.

Then, in step ST24, the first resist 41 is removed as shown in the middle part of FIG. 9. The first thin film 31 of the sub-pixel SP1 is thereby exposed. The display element 201 is formed in the sub-pixel SP1 through steps ST21 to ST24.

Then, in step ST31, as shown in a lower part of FIG. 9, the second thin film 32 is formed over the sub-pixel SP1, sub-pixel SP2, and the sub-pixel SP3. The second thin film 32 overlaps the first thin film 31 of the sub-pixel SP1, overlaps the lower electrode LE2 in the aperture AP2 of the sub-pixel SP2, overlaps the lower electrode LE3 in the aperture AP3 of the sub-pixel SP3, overlaps the rib 5, and covers the lower portion 61 and the upper portion 62 of the partition 6.

As shown in FIG. 3, the second thin film 32 includes an organic layer OR2 including a light emitting layer EM2 which emits light in the green wavelength range, an upper electrode UE2 arranged on the organic layer OR2, a cap layer CP2 arranged on the upper electrode UE2, and a sealing layer SE2 arranged on the cap layer CP2.

Then, in step ST32, the second resist 42 is formed on the second thin film 32 as shown in FIG. 10.

First, the second resist 42 is applied over the entire surface on the second thin film 32, as shown in the upper part of FIG. 10. At this time, the second resist 42 is embedded in the voids of the second thin film 32 formed below the protrusions 621, 622, and 623.

After that, as shown in the middle part of FIG. 10, the second resist 42 is exposed by applying a photomask M2 having a predetermined aperture pattern. As described above, the second resist 42 is a negative resist. A photomask M2 having an aperture pattern corresponding to the sub-pixel SP1 and the sub-pixel SP2 is applied. As a result, the second resist 42 of the sub-pixel SP1 and the sub-pixel SP2 is exposed, while the second resist 42 of the sub-pixel SP3 is not exposed.

After that, as shown in the lower part of FIG. 10, the second resist 42 is cured after the second resist 42 is developed. As a result, the second resist 42 covers the second thin film 32 of the sub-pixel SP1 and the sub-pixel SP2 and exposes the second thin film 32 of the sub-pixel SP3. In addition, the second resist 42 remains in the voids below the protrusions 621 and 622 and is removed from the void below the protrusion 623.

Then, in step ST33, as shown in the upper part of FIG. 11, etching is performed using the second resist 42 as a mask to remove the second thin film 32 of the sub-pixel SP3 exposed from the second resist 42, and the second thin film 32 remains in the sub-pixel SP1 and the sub-pixel SP2. In other words, the sealing layer SE2, the cap layer CP2, the upper electrode UE2, and the organic layer OR2 in the sub-pixel SP3 are removed. As a result, the lower electrode LE3 is exposed through the aperture AP3 in the sub-pixel SP3, and the rib 5 surrounding the lower electrode LE3 is also exposed.

Then, in step ST34, the second resist 42 is removed as shown in the lower part of FIG. 11. The second thin film 32 of the sub-pixel SP2 is thereby exposed. The display element 202 is formed in the sub-pixel SP2 through steps ST31 to ST34. In addition, in the sub-pixel SP1, the second thin film 32 overlapping the first thin film 31 is exposed.

Then, in step ST35, the third resist 43 is formed as shown in FIG. 12.

First, as shown in an upper part of FIG. 12, the third resist 43 is applied over the sub-pixels SP1, SP2, and SP3. At this time, the third resist 43 overlaps the second thin film 32 of the sub-pixel SP1 and sub-pixel SP2, overlaps the lower electrode LE3 of the sub-pixel SP3 and the rib 5, and covers the partition 6. In addition, the third resist 43 is embedded in the voids formed below the protrusions 621, 622, and 623.

After that, as shown in the middle part of FIG. 12, the third resist 43 is exposed by applying a photomask M3 having a predetermined aperture pattern. As described above, the third resist 43 is a positive resist. A photomask M3 having an aperture pattern corresponding to the sub-pixel SP1 is applied. As a result, the third resist 43 of the sub-pixel SP1 is exposed, but the third resist 43 below the protrusion 621 is not exposed since the protrusion 621 is formed of a light-shielding material. The third resist 43 of the sub-pixel SP2 and the sub-pixel SP3 is not exposed.

After that, as shown in the lower part of FIG. 12, the third resist 43 is cured after the third resist 43 is developed. As a result, the third resist 43 covers the second thin film 32 of the sub-pixel SP2, covers the lower electrode LE3 of the sub-pixel SP3, and exposes the second thin film 32 of the sub-pixel SP1. In addition, the third resist 43 remains in the void below the protrusion 621.

Then, in step ST36, as shown in the upper part of FIG. 13, etching is performed using the third resist 43 as a mask to remove the second thin film 32 of the sub-pixel SP1 exposed from the third resist 43. At this time, the third resist 43 which remains below the protrusion 621 serves as a mask, and the second thin film 32 partially remains.

Then, in step ST37, the third resist 43 is removed as shown in the middle part of FIG. 13.

Then, in step ST41, as shown in a lower part of FIG. 13, the third thin film 33 is formed over the sub-pixel SP1, the sub-pixel SP2, and the sub-pixel SP3. The third thin film 33 overlaps the first thin film 31 of the sub-pixel SP1, overlaps the second thin film 32 of the sub-pixel SP2, overlaps the lower electrode LE3 in the aperture AP3 of the sub-pixel SP3, overlaps the rib 5, and covers the lower portion 61 and the upper portion 62 of the partition 6.

As shown in FIG. 3, the third thin film 33 includes an organic layer OR3 including a light emitting layer EM3 which emits light in the red wavelength range, an upper electrode UE3 arranged on the organic layer OR3, a cap layer CP3 arranged on the upper electrode UE3, and a sealing layer SE3 arranged on the cap layer CP3.

Then, in step ST42, the fourth resist 44 is formed on the third thin film 33 as shown in FIG. 14.

First, the fourth resist 44 is applied over the entire surface on the third thin film 33, as shown in the upper part of FIG. 14. At this time, the fourth resist 44 is embedded in the voids formed below the protrusions 621, 622, and 623.

After that, as shown in a middle part of FIG. 14, the fourth resist 44 is exposed by applying a photomask M4 having a predetermined aperture pattern. As described above, the fourth resist 44 is a positive resist. The photomask M4 having an aperture pattern corresponding to the sub-pixel SP1 and the sub-pixel SP2 is applied. As a result, the fourth resist 44 of the sub-pixel SP1 and the sub-pixel SP2 is exposed, while the fourth resist 44 of the sub-pixel SP3 is not exposed. In addition, the fourth resist 44 below the protrusions 621 and 622 is not exposed since the protrusions 621 and 622 are formed of a light-shielding material.

After that, as shown in a lower part of FIG. 14, the fourth resist 44 is cured after the fourth resist 44 is developed. As a result, the fourth resist 44 covers the third thin film 33 of the sub-pixel SP3 and exposes the third thin film 33 of the sub-pixel SP1 and the sub-pixel SP2. In addition, the fourth resist 44 remains in the voids below the protrusions 621 and 622.

Then, in step ST43, as shown in an upper part of FIG. 15, etching is performed using the fourth resist 44 as a mask to remove the third thin film 33 of the sub-pixel SP1 and the sub-pixel SP2 exposed from the fourth resist 44, and the third thin film 33 remains in the sub-pixel SP3. In other words, the sealing layer SE3, the cap layer CP3, the upper electrode UE3, and the organic layer OR3 in the sub-pixel SP1 and the sub-pixel SP2 are removed. At this time, the fourth resist 44 which remains below the protrusion 621 and the protrusion 622 serves as a mask, and the third thin film 33 partially remains.

Then, in step ST44, the fourth resist 44 is removed as shown in the lower part of FIG. 15. The third thin film 33 of the sub-pixel SP3 is thereby exposed. The display element 203 is formed in the sub-pixel SP3 through steps ST41 to ST44.

The display element 201 is formed in the sub-pixel SP1, the display element 202 is formed in the sub-pixel SP2, and the display element 203 is formed in the sub-pixel SP3, by the above processes.

Of the above processes, the light emitting layer EM1 may be formed of a material which emits light in the red wavelength range in the process of forming the first thin film 31 in step ST21, the light emitting layer EM2 may be formed of a material which emits light in the green wavelength range in the process of forming the second thin film 32 in step ST31, and the light emitting layer EM3 may be formed of a material which emits light in the blue wavelength range in the process of forming the third thin film 33 in step ST41.

In the above example, the sub-pixel SP1 corresponds to the first sub-pixel, the aperture AP1 corresponds to the first aperture, the lower electrode LE1 corresponds to the first lower electrode, the organic layer OR1 corresponds to the first organic layer, the light emitting layer EM1 corresponds to the first light emitting layer, the upper electrode UE1 corresponds to the first upper electrode, the cap layer CP1 corresponds to the first cap layer, and the sealing layer SE1 corresponds to the first sealing layer.

In addition, the sub-pixel SP2 corresponds to the second sub-pixel, the aperture AP2 corresponds to the second aperture, the lower electrode LE2 corresponds to the second lower electrode, the organic layer OR2 corresponds to the second organic layer, the light emitting layer EM2 corresponds to the second light emitting layer, the upper electrode UE2 corresponds to the second upper electrode, the cap layer CP2 corresponds to the second cap layer, and the sealing layer SE2 corresponds to the second sealing layer.

In addition, the sub-pixel SP3 corresponds to the third sub-pixel, the aperture AP3 corresponds to the third aperture, the lower electrode LE3 corresponds to the third lower electrode, the organic layer OR3 corresponds to the third organic layer, the light emitting layer EM3 corresponds to the third light emitting layer, the upper electrode UE3 corresponds to the third upper electrode, the cap layer CP3 corresponds to the third cap layer, and the sealing layer SE3 corresponds to the third sealing layer.

According to the embodiment, the first resist 41 for patterning the first thin film 31 is a negative resist. When voids of the first thin film 31 are formed below the protrusions 622 and 623, the first resist 41 embedded below the protrusions 622 and 623 is unexposed and is therefore removed to expose the first thin film 31 (lower part in FIG. 8). For this reason, when the first thin film 31 is etched, the first thin film 31 below the protrusions 622 and 623 is removed and the partition 6 is exposed (upper part in FIG. 9). As a result, electric connection between the second thin film 32, which is to be subsequently formed, and the partition 6 can be made (lower part in FIG. 9).

The second resist 42 for patterning the second thin film 32 is a negative resist. When the void of the second thin film 32 is formed below the protrusion 623, the second resist 42 embedded below the protrusion 623 is unexposed and is therefore removed to expose the second thin film 32 (lower part in FIG. 10). For this reason, when the second thin film 32 is etched, the second thin film 32 below the protrusion 623 is removed and the partition 6 is exposed (upper part in FIG. 11). As a result, electric connection between the third thin film 33, which is to be subsequently formed, and the partition 6 can be made (lower part in FIG. 13).

In the process of removing the second thin film 32 which overlaps the first thin film 31 of the sub-pixel SP1, the third resist 43 for patterning the second thin film 32 is the positive resist. When the void of the second thin film 32 is formed below the protrusion 621, the third resist 43 embedded below the protrusion 621 is unexposed and therefore remains (lower part in FIG. 12). For this reason, when the second thin film 32 is etched, the third resist 43 functions as an etching stopper, and the first thin film 31 below the protrusion 621 is protected (upper part in FIG. 13). As a result, the destruction of the sealing layer SE1 included in the first thin film 31 is suppressed, and the display failure caused by entry of moisture can be suppressed.

In the process of removing the third thin film 33 which overlaps the first thin film 31 of the sub-pixel SP1 and the third thin film 33 which overlaps the second thin film 32 of the sub-pixel SP2, the fourth resist 44 for patterning the third thin film 33 is the positive resist. When the voids of the third thin film 33 are formed below the protrusions 621 and 622, the fourth resist 44 embedded below the protrusions 621 and 622 is unexposed and therefore remains (lower part in FIG. 14). For this reason, when the third thin film 33 is etched, the fourth resist 44 functions as an etching stopper, and the first thin film 31 under the protrusion 621 and the second thin film 32 below the protrusion 622 are protected (upper part in FIG. 15). As a result, the destruction of the sealing layer SE1 included in the first thin film 31 and the sealing layer SE2 included in the second thin film 32 is suppressed, and the display failure caused by entry of moisture can be suppressed.

As described above, according to the embodiment, the display device manufacturing method capable of suppressing the reduction in reliability and improving the manufacturing yield can be provided.

All of the methods of manufacturing display devices that can be implemented by a person of ordinary skill in the art through arbitrary design changes to the methods of manufacturing display devices described above as embodiments of the present invention come within the scope of the present invention as long as they are in keeping with the spirit of the present invention.

Various types of the modified examples are easily conceivable within the category of the ideas of the present invention by a person of ordinary skill in the art and the modified examples are also considered to fall within the scope of the present invention. For example, additions, deletions or changes in design of the constituent elements or additions, omissions, or changes in condition of the processes arbitrarily conducted by a person of ordinary skill in the art, in the above embodiments, fall within the scope of the present invention as long as they are in keeping with the spirit of the present invention.

In addition, the other advantages of the aspects described in the embodiments, which are obvious from the descriptions of the present specification or which can be arbitrarily conceived by a person of ordinary skill in the art, are considered to be achievable by the present invention as a matter of course.

What is claimed is:

1. A display device manufacturing method comprising:
preparing a processing substrate on which a first lower electrode of a first sub-pixel, a second lower electrode of a second sub-pixel, and a third lower electrode of a third sub-pixel are formed, and a rib including a first aperture overlapping the first lower electrode, a second aperture overlapping the second lower electrode, and a third aperture overlapping the third lower electrode is formed;

forming a partition which includes a lower portion located on the rib and formed of a conductive material, and an upper portion located on the lower portion and protruding from a side surface of the lower portion, the lower portion being spaced apart from each of the first lower electrode, the second lower electrode and the third lower electrode;

forming a first thin film including a first light emitting layer over the first sub-pixel, the second sub-pixel, and the third sub-pixel;

forming a negative first resist exposing the first thin film of the second sub-pixel and the third sub-pixel and covering the first thin film of the first sub-pixel;

removing the first thin film of the second sub-pixel and the third sub-pixel using the first resist as a mask, leaving the first thin film in the first sub-pixel, exposing the second lower electrode from the second aperture, and exposing the third lower electrode from the third aperture;

removing the first resist;

forming a second thin film including a second light emitting layer over the first sub-pixel, the second sub-pixel, and the third sub-pixel;

forming a negative second resist exposing the second thin film of the third sub-pixel and covering the second thin film of the first sub-pixel and the second sub-pixel;

removing the second thin film of the third sub-pixel using the second resist as a mask, leaving the second thin film in the first sub-pixel and the second sub-pixel, and exposing the third lower electrode from the third aperture;

removing the second resist;

forming a positive third resist exposing the second thin film of the first sub-pixel, and covering the second thin film of the second sub-pixel and the third lower electrode of the third sub-pixel;

removing the second thin film of the first sub-pixel using the third resist as a mask; and removing the third resist, wherein the first sub-pixel, the second sub-pixel and the third sub-pixel are formed on an upper surface of the processing substrate, the rib includes:

a lower surface extending in parallel to the upper surface of the processing substrate; and an upper surface opposing the lower surface, extending parallel to the lower surface, and being further from the upper surface of the processing substrate compared to the lower surface, the lower portion of the partition includes:

a lower surface in direct contact with the upper surface of the rib and extending parallel to the upper surface of the rib; and an upper surface opposing the lower surface and extending in parallel to the lower surface, the upper portion of the partition includes:

a lower surface in direct contact with the upper surface of the lower portion of the partition, protruding from the side surface of the lower portion of the partition, and extending parallel to the upper surface of the lower portion of the partition; and an upper surface opposing the lower surface and extending in parallel to the lower surface, the first sub-pixel and the second sub-pixel are arranged in a first direction, and a width of the upper portion of the partition in the first direction is greater than a width of the lower portion of the partition in the first direction.

2. The display device manufacturing method of claim 1, comprising:

after removing the third resist, further forming a third thin film including a third light emitting layer over the first sub-pixel, the second sub-pixel, and the third sub-pixel;

forming a positive fourth resist exposing the third thin film of the first sub-pixel and the second sub-pixel and covering the third thin film of the third sub-pixel;

removing the third thin film of the first sub-pixel and the second sub-pixel using the fourth resist as a mask, and leaving the third thin film on the third sub-pixel; and removing the fourth resist.

3. The display device manufacturing method of claim 2, wherein the first thin film includes:

a first organic layer located on the first lower electrode and including the first light emitting layer; and a first upper electrode located on the first organic layer:

the second thin film includes:

a second organic layer located on the second lower electrode and including the second light emitting layer; and a second upper electrode located on the second organic layer:

the third thin film includes:

a third organic layer located on the third lower electrode and including the third light emitting layer; and a third upper electrode located on the third organic layer;

the first light emitting layer is formed of a material emitting light of a blue wavelength range in response to a potential difference between the first lower electrode and the first upper electrode, the second light emitting layer is formed of a material emitting light of a green wavelength range in response to a potential difference between the second lower electrode and the second upper electrode, and the third light emitting layer is formed of a material emitting light of a red wavelength range in response to a potential difference between the third lower electrode and the third upper electrode.

4. The display device manufacturing method of claim 2, wherein the first thin film includes:

a first organic layer located on the first lower electrode and including the first light emitting layer; and a first upper electrode located on the first organic layer;

the second thin film includes:

a second organic layer located on the second lower electrode and including the second light emitting layer; and a second upper electrode located on the second organic layer;

the third thin film includes:

a third organic layer located on the third lower electrode and including the third light emitting layer; and a third upper electrode located on the third organic layer;

the first light emitting layer is formed of a material emitting light of a red wavelength range in response to a potential difference between the first lower electrode and the first upper electrode, the second light emitting layer is formed of a material emitting light of a green wavelength range in response to a potential difference between the second lower electrode and the second upper electrode, and the third light emitting layer is formed of a material emitting light of a blue wavelength range in response to a potential difference between the third lower electrode and the third upper electrode.

5. The display device manufacturing method of claim 1, wherein the first thin film includes:

a first organic layer located on the first lower electrode and including the first light emitting layer;

a first upper electrode located on the first organic layer and being in contact with the lower portion of the partition;

a first cap layer located on the first upper electrode; and a first sealing layer located on the first cap layer.

6. The display device manufacturing method of claim 5, wherein the forming the second thin film includes forming the second thin film on the first thin film of the first sub-pixel, on the second lower electrode, and on the third lower electrode.

7. The display device manufacturing method of claim 6, wherein the second thin film includes:

a second organic layer located on the second lower electrode and including the second light emitting layer;

a second upper electrode located on the second organic layer and being in contact with the lower portion of the partition;

a second cap layer located on the second upper electrode; and a second sealing layer located on the second cap layer.

8. The display device manufacturing method of claim 7, wherein the forming the third thin film includes forming the third thin film on the first thin film of the first sub-pixel, on the second thin film of the second sub-pixel, and on the third lower electrode.

9. The display device manufacturing method of claim 8, wherein the third thin film includes:

a third organic layer located on the third lower electrode and including the third light emitting layer;

a third upper electrode located on the third organic layer and being in contact with the lower portion of the partition;

a third cap layer located on the third upper electrode; and a third sealing layer located on the third cap layer.

10. The display device manufacturing method of claim 9, wherein the rib, the first sealing layer, the second sealing layer, and the third sealing layer are formed of silicon nitride.

11. The display device manufacturing method of claim 5, wherein the rib, the lower portion of the partition and the upper portion of the partition are stacked in a third direction, the first thin film forms a first void between the lower surface of the upper portion of the partition and the upper surface of the rib in the third direction, and when the first resist is formed, a part of the first resist is embedded in the first void.

12. The display device manufacturing method of claim 11, wherein when the first resist is removed, the part of the first resist embedded in the first void is removed.

13. The display device manufacturing method of claim 12, wherein the second thin film forms a second void between the lower surface of the upper portion of the partition and the upper surface of the rib in the third direction, and when the second resist is formed, a part of the second resist is embedded in the second void.

14. The display device manufacturing method of claim 13, wherein when the second resist is removed, the part of the second resist embedded in the second void is removed.

15. The display device manufacturing method of claim 5, wherein the first sealing layer is in direct contact with the lower surface of the upper portion of the partition.

16. The display device manufacturing method of claim 15, wherein the side surface of the lower portion of the partition connects the upper surface of the lower portion of the partition to the lower surface of the lower portion of the partition, and the first sealing layer is in direct contact with the side surface of the lower portion of the partition.

17. The display device manufacturing method of claim 16, wherein the first upper electrode is in direct contact with the side surface of the lower portion of the partition.

18. The display device manufacturing method of claim 17, wherein the first upper electrode is in direct contact with the upper surface of the rib.

19. The display device manufacturing method of claim 1, wherein the rib, the lower portion of the partition and the upper portion of the partition are stacked in a third direction, a thickness of the lower portion of the partition in the third direction is greater than a thickness of the rib in the third direction.

20. The display device manufacturing method of claim 19, wherein the thickness of the lower portion of the partition in the third direction is greater than a thickness of the upper portion of the partition in the third direction.

* * * * *